(12) United States Patent
Chung et al.

(10) Patent No.: US 9,165,935 B2
(45) Date of Patent: Oct. 20, 2015

(54) SEMICONDUCTOR DEVICES AND METHODS FOR MANUFACTURING THE SAME

(75) Inventors: Hyun-Woo Chung, Seoul (KR); Jiyoung Kim, Yongin-si (KR); Yongchul Oh, Suwon-si (KR); Sungkwan Choi, Hwaseong-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 431 days.

(21) Appl. No.: 13/533,373

(22) Filed: Jun. 26, 2012

(65) Prior Publication Data

US 2013/0001675 A1    Jan. 3, 2013

(30) Foreign Application Priority Data

Jun. 30, 2011    (KR) ........................ 10-2011-0064610

(51) Int. Cl.
*H01L 27/108*    (2006.01)

(52) U.S. Cl.
CPC .... H01L 27/10876 (2013.01); H01L 27/10823 (2013.01)

(58) Field of Classification Search
CPC .................... H01L 27/10823; H01L 27/10876
See application file for complete search history.

(56) References Cited

U.S. PATENT DOCUMENTS

| | | | |
|---|---|---|---|
| 7,872,301 B2 | 1/2011 | Takaishi | |
| 2008/0283907 A1 | 11/2008 | Takaishi | |
| 2009/0004813 A1 | 1/2009 | Lee | |
| 2009/0230459 A1* | 9/2009 | Kito et al. | 257/324 |
| 2010/0090263 A1* | 4/2010 | Kunkel et al. | 257/296 |
| 2011/0156119 A1 | 6/2011 | Chung et al. | |

FOREIGN PATENT DOCUMENTS

| | | |
|---|---|---|
| JP | 2008-288391 | 11/2008 |
| KR | 10-0910870 | 12/2008 |
| KR | 10-0898582 | 3/2009 |
| KR | 10-0967678 | 5/2009 |
| KR | 10-1019701 | 2/2010 |
| KR | 10-2011-0078504 | 7/2011 |

OTHER PUBLICATIONS

Machine English translation of KR10-0967678.*

* cited by examiner

*Primary Examiner* — Yu Chen
(74) *Attorney, Agent, or Firm* — Onello & Mello, LLP.

(57) ABSTRACT

A semiconductor device includes a semiconductor substrate including first trenches defining outer sidewalls of a pair of active pillars and a second trench defining opposing inner sidewalls of the pair of active pillars. The second trench may have a bottom surface located at a higher level than bottom surface of the first trench. Auxiliary conductive lines may be disposed in the first trenches to cover and cross the outer sidewalls of the pair of active pillars. A pair of main conductive lines may be disposed in a pair of recessed regions that are laterally recessed from lower portions of the inner sidewalls of the active pillars into the pair of active pillars. A common impurity region may be disposed in the semiconductor substrate under the second trench. Upper impurity regions may be disposed in upper portions of the active pillars.

7 Claims, 30 Drawing Sheets

SEMICONDUCTOR DEVICES AND METHODS FOR MANUFACTURING THE SAME

CROSS-REFERENCE TO RELATED APPLICATIONS

This U.S. non-provisional patent application claims priority under 35 U.S.C. §119 to Korean Patent Application No. 10-2011-0064610, filed on Jun. 30, 2011, the entirety of which is incorporated by reference herein.

BACKGROUND

1. Technical Field

The present disclosure relates to semiconductor devices and methods for manufacturing the same.

2. Description of Related Art

Process technologies for reducing line widths of patterns have been continuously developed to increase the integration density of semiconductor devices. However, the process technologies for forming fine and small patterns for future semiconductor devices may require new and expensive photolithography processes.

Three-dimensional electronic structures, such as vertical MOS transistors, that increase the integration density of semiconductor devices have been developed. A vertical MOS transistor may include vertical source/drain regions, with a channel region positioned between them. The vertical orientation of such a device may allow for higher integration density while, at the same time, overcoming some of the obstacles to higher-level integration of planar MOS transistors, such as short-channel effects, for example. Innovative structures and methods of manufacturing three-dimensional electronic devices would be highly desirable.

SUMMARY

Exemplary embodiments in accordance with principles of inventive concepts may disclose semiconductor devices and methods for manufacturing the same.

In an exemplary embodiment in accordance with principles of inventive concepts, a semiconductor device includes a semiconductor substrate including first trenches defining outer sidewalls of a pair of active pillars and a second trench defining opposing inner sidewalls of the pair of active pillars. The second trench has a bottom surface located at a higher level than bottom surfaces of the first trenches. Auxiliary conductive lines may be disposed in the first trenches to cover and cross the outer sidewalls of the pair of active pillars. Each one of a pair of main conductive lines may be disposed in each of a pair of recessed regions that are laterally recessed from lower portions of the inner sidewalls of the active pillars into the pair of active pillars. A common impurity region may be disposed in the semiconductor substrate under the second trench. Upper impurity regions may be disposed in upper portions of the active pillars.

In an exemplary embodiment in accordance with principles of inventive concepts, the semiconductor device includes a semiconductor substrate including first trenches defining outer sidewalls of a pair of active pillars and a second trench defining opposing inner sidewalls of the pair of active pillars. The second trench may have a bottom surface located at a higher level than bottom surfaces of the first trenches. Auxiliary conductive lines may be disposed in respective ones of the first trenches to cover and cross the outer sidewalls of the pair of active pillars. A pair of main conductive lines may be disposed in the second trench and disposed on opposing inner sidewalls of the active pillars. A common impurity region may be disposed in the semiconductor substrate under the second trench. Upper impurity regions may be disposed in upper portions of the active pillars. The pair of active pillars may be disposed between a pair of first isolation patterns. Second isolation patterns fill the first trenches on the auxiliary conductive lines. The first isolation patterns are non-parallel with the second isolation patterns, and bottom surfaces of the second isolation patterns may be located at a higher level than bottom surfaces of the first isolation patterns.

In an exemplary embodiment in accordance with principles of inventive concepts, a method includes forming isolation layers in a semiconductor substrate to define preliminary active patterns having a line shape, forming a pair of first trenches crossing the isolation layers and the preliminary active patterns, and forming a second trench between the pair of first trenches. The second trench may be substantially parallel with the first trenches and shallower than the first trenches. A pair of main conductive lines may be formed in the second trench. A common impurity region may be formed in the semiconductor substrate under the second trench. Upper impurity regions may be formed in upper portions of the semiconductor substrate between the first trenches and the second trench.

In an exemplary embodiment in accordance with principles of inventive concepts, a semiconductor device may include first and second active pillars formed on a substrate, each active pillar including an upper impurity region. A common lower impurity region may be formed below the first and second active pillars. First and second conductors may be vertically positioned to control respective channel regions of first and second active pillars and a pillar anti-isolation mechanism may be positioned to prevent electrical isolation of first and second pillars from the semiconductor substrate. The pillar anti-isolation mechanism may be positioned to create an inversion layer in a portion of the common lower impurity region and may include third and fourth conductors positioned below first and second conductors. The conductivity type of the first and second conductors may be different than the conductivity type of the third and fourth conductors. Lower portions of the third and fourth conductors are in contact with the semiconductor substrate.

BRIEF DESCRIPTION OF THE DRAWINGS

The above and other features and advantages of the present inventive concepts will become more apparent by describing in detail various embodiments thereof with reference to the attached drawings.

FIGS. 9A to 18A are plan views illustrating a method of manufacturing an exemplary embodiment of a semiconductor device in accordance with principles of inventive concepts.

FIGS. 9B to 18B are merged cross sectional views taken along lines I-I' and II-II' of FIGS. 9A to 18A, respectively, to illustrate a method of manufacturing an exemplary embodiment of a semiconductor device in accordance with principles of inventive concepts.

DETAILED DESCRIPTION OF THE EMBODIMENTS

Figure 1:
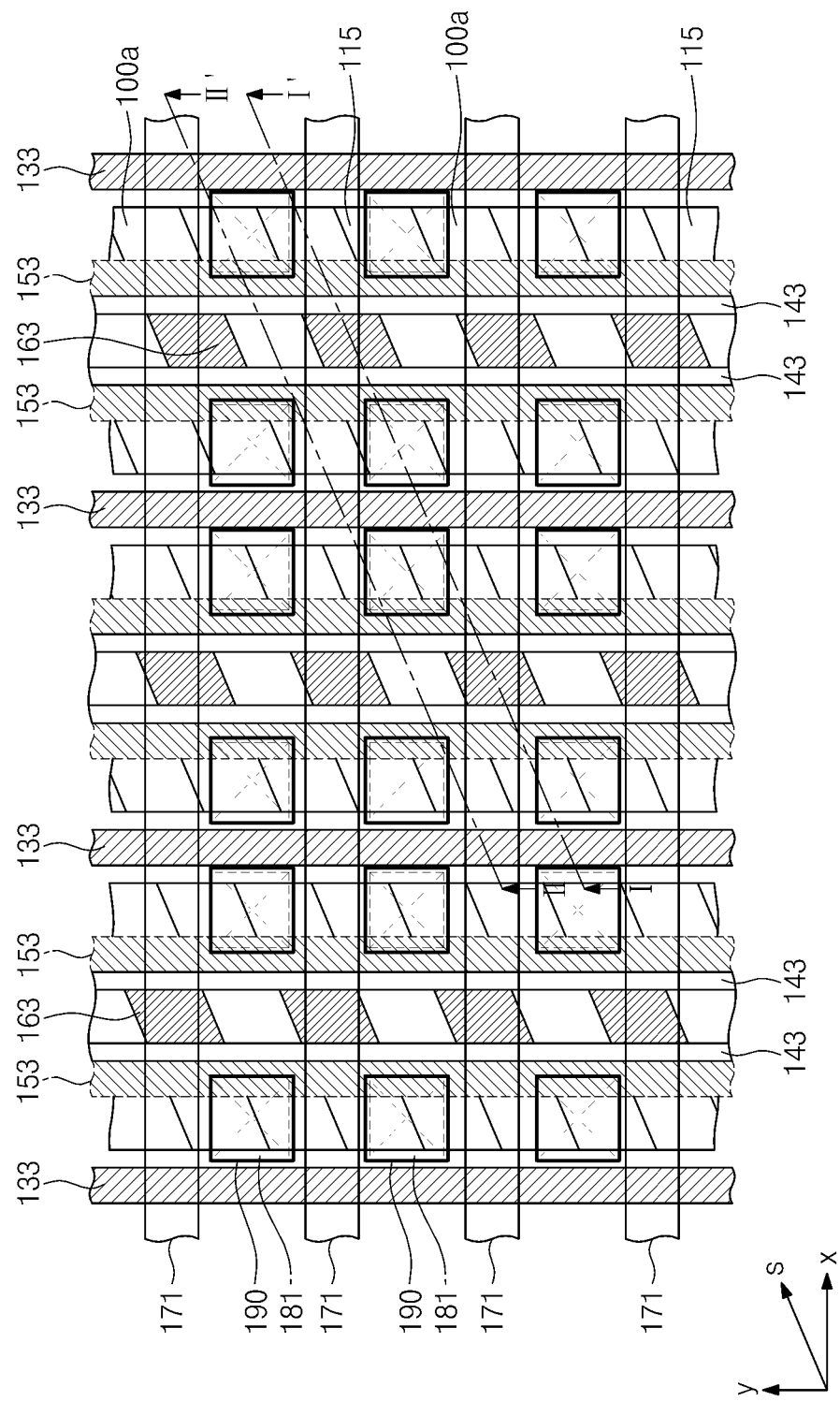
FIG. 1 is a plan view of an exemplary embodiment of a semiconductor device in accordance with principles of inventive concepts.

Exemplary embodiments of the inventive concepts will now be described more fully with reference to the accompanying drawings, in which exemplary embodiments of the inventive concept are shown. Exemplary embodiments of the inventive concept may, however, be embodied in many different forms and should not be construed as limited to the embodiments set forth herein; rather, these exemplary embodiments of the inventive concept are provided so that this description will be thorough and complete, and will fully convey the concept of exemplary embodiments of the inventive concept to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of the inventive concept only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to cross-sectional illustrations that are schematic illustrations of idealized exemplary embodiments of the inventive concept (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
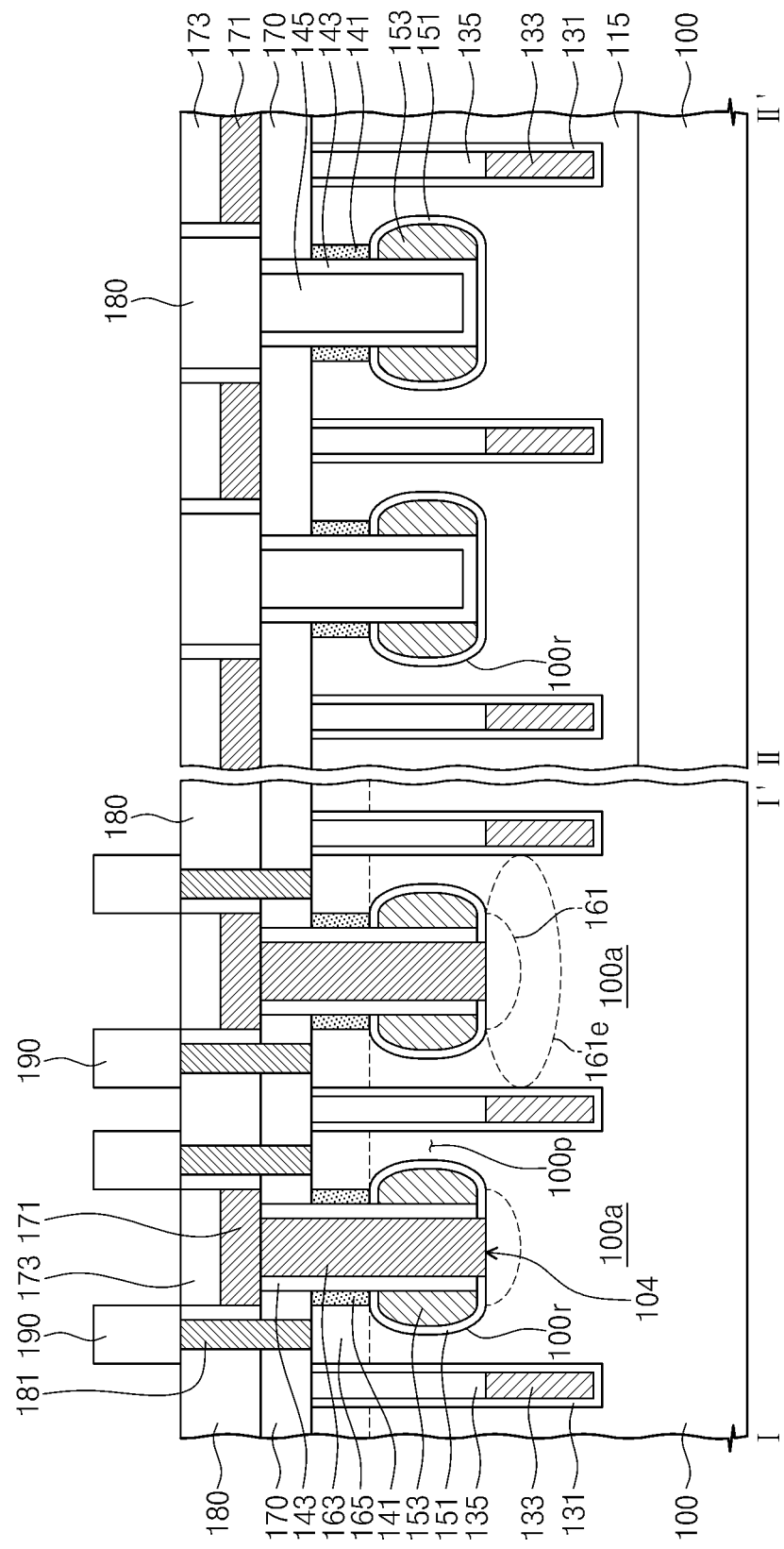
FIG. 2 is a merged cross sectional view taken along lines I-I' and II-II' of FIG. 1 to illustrate an exemplary embodiment of a semiconductor device in accordance with principles of inventive concepts.
Figure 3:
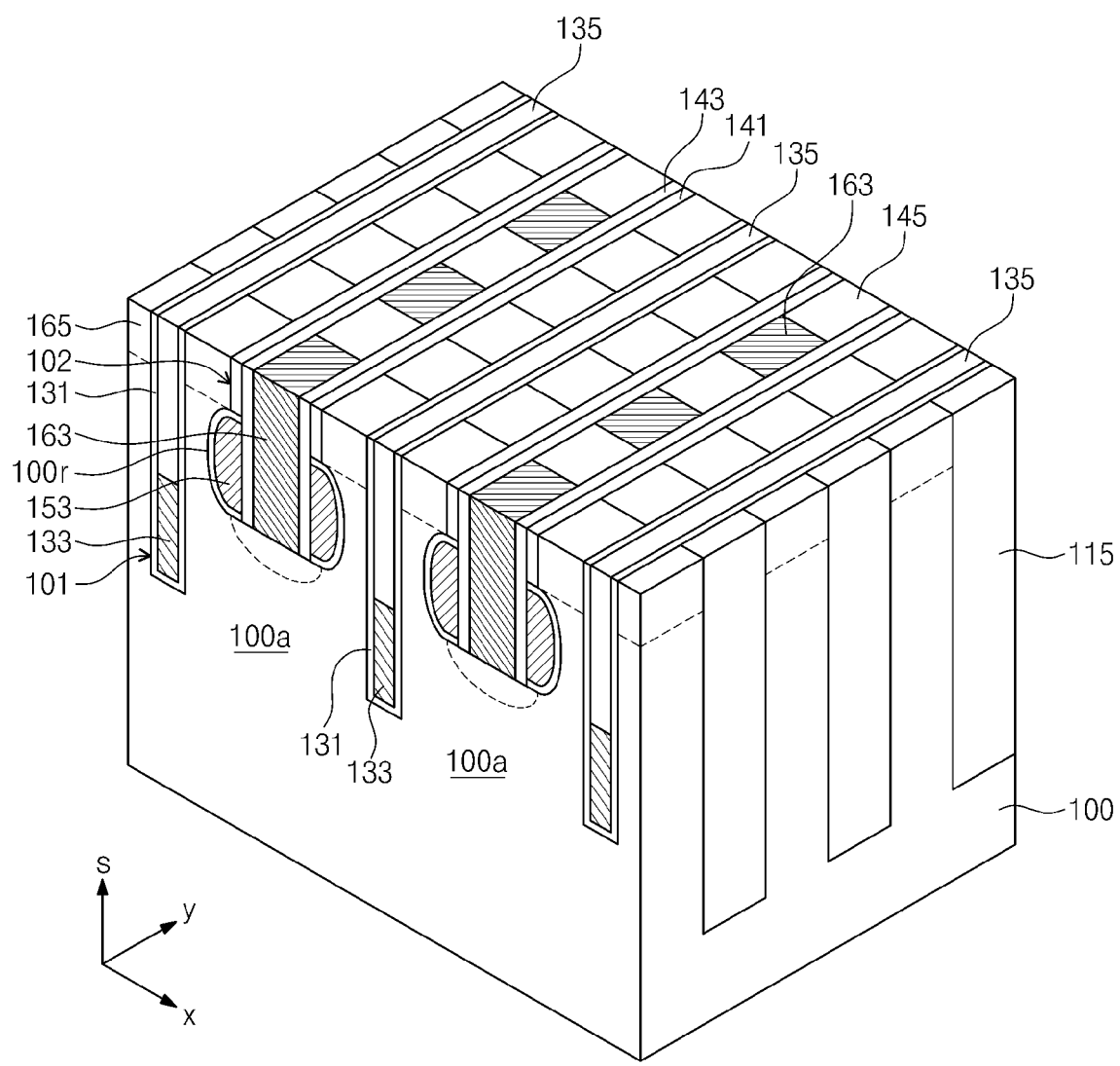
FIG. 3 is a perspective view of an exemplary embodiment of a semiconductor device in accordance with principles of inventive concepts.

FIG. 1 is a plan view of an exemplary embodiment of a semiconductor device in accordance with principles of inventive concepts, and FIG. 2 is a merged cross sectional view taken along lines I-I' and II-II' of FIG. 1. FIG. 3 is a perspective view of an exemplary embodiment of a semiconductor device in accordance with principles of inventive concepts.

Referring to FIGS. 1 to 3, an exemplary embodiment of a semiconductor device in accordance with principles of inventive concepts may include a semiconductor substrate 100 having a plurality of active patterns 100a. Semiconductor substrate 100 may be a silicon substrate, a germanium substrate or a silicon-germanium substrate, for example.

Each of the active patterns 100a may include a pair of active pillars 100p extending from semiconductor substrate 100. Active patterns 100a may be two-dimensionally arrayed along a plurality of rows and a plurality of columns, and each of the active patterns 100a may have a rectangular, or bar, shape oriented parallel with, that is, with its major axis parallel with, a first direction. The first direction may be parallel with a top surface of semiconductor substrate 100 and may correspond to a direction indicated by an arrow "s" illustrated in a plan view of FIG. 1.

In an exemplary embodiment in accordance with principles of inventive concepts, outer sidewalls of the pair of active pillars 100p included in each active pattern 100a may be defined by first trenches 101 formed in the semiconductor substrate 100. The first trenches 101 may extend in a second direction (e.g., a y-axis direction shown in FIGS. 1 and 3) that is non-parallel with the first direction, s. Two opposite inner sidewalls of the pair of active pillars 100p may be defined a second trench 104 that is substantially parallel with the first trenches 101 and is disposed between the pair of active pillars 100p. A bottom surface of the second trench 104 may be located at a higher level than a bottom surface of the first trenches 101.

Each active pattern 100a having a pair of active pillars 100p may correspond to a portion of the semiconductor substrate 100 that is surrounded by first isolation patterns 115 and second isolation patterns 135. First isolation patterns 115 may extend in the first direction, s, to be substantially parallel with the active patterns 100a. First isolation patterns 115 may be disposed among active patterns 100a that are adjacent in the second direction, y. Second isolation patterns 135 may be disposed in the first trenches 101, respectively. That is, the second isolation patterns 135 may extend in the second direction that is non-parallel with the first direction, s. The second isolation patterns 135 may be disposed among the active patterns 100a that are adjacent in the first direction, s. The second direction may be parallel with the top surface of the semiconductor substrate 100 and may correspond to a direction indicated by an arrow "y" illustrated in FIGS. 1 and 3. Each of first and second isolation patterns 115 and 135 may include a single-layered material or a multi-layered material. For example, each of first and second isolation patterns 115 and 135 may include a silicon oxide layer and/or a silicon nitride layer. In an exemplary embodiment in accordance with principles of inventive concepts, bottom surfaces of first isolation patterns 115 may be located at a lower level than bottom surfaces of the second isolation patterns 135.

In an exemplary embodiment in accordance with principles of inventive concepts, the pair of active pillars 100p included in active pattern 100a may be disposed between the pair of second isolation patterns 135 that are adjacent in the first direction, s, and the second trench 104 may be disposed between the pair of active pillars 100p. Upper portions of active pillars 100p may have substantially the same width.

In an exemplary embodiment in accordance with principles of inventive concepts, the pair of active pillars 100p may include a pair of outer sidewalls adjacent to second isolation patterns 135 and a pair of inner sidewalls opposite to each other. Lower portions of the inner sidewalls of active pillars 100p may have rounded profiles to provide lateral recessed regions 100r. That is, recessed regions 100r may be symmetrical with respect to a vertical axis passing through a central point of second trench 104 between the pair of inner sidewalls. Thus, a lower width of second trenches 104 may be greater than an upper width thereof because of the presence of recessed regions 100r.

Recessed regions 100r in second trenches 104 may extend in the second direction, y to pass through first isolation patterns 115. Thus, each of first isolation patterns 115 may also have recessed regions 100r extending from active patterns 100a. As a result, recessed regions 100r in active patterns 100a and first isolation patterns 115 may extend in the second direction, y.

In an exemplary embodiment in accordance with principles of inventive concepts, each of active patterns 100a may include a pair of upper impurity regions 165 formed in upper regions of active pillars 100p and a common impurity region 161 formed in active pattern 100a under second trench 104. Upper impurity regions 165 may be located at a higher level than recessed regions 100r. Active pillars 100p between upper impurity regions 165 and common impurity region 161 may act as channel regions of field effect transistors (also referred to as MOS transistors).

In an exemplary embodiment in accordance with principles of inventive concepts, active patterns 100a may be initially doped with impurities of a first conductivity type, and upper impurity regions 165 and common impurity region 161 may be doped with impurities of a second conductivity type. For example, original active patterns 100a may be doped with p-type dopants, and the upper impurity regions 165 and the common impurity region 161 may be doped with n-type dopants. Alternatively, original active patterns 100a may be doped with n-type dopants, and upper impurity regions 165 and common impurity region 161 may be doped with p-type dopants, for example.

An exemplary semiconductor device in accordance with principles of inventive concepts may include auxiliary conductive lines 133 and main conductive lines 153 buried in semiconductor substrate 100.

Auxiliary conductive lines 133 may be disposed in first trenches 101 under second isolation patterns 135. Auxiliary conductive lines 133 may extend in the second direction, y to be substantially parallel with the second isolation patterns 135. The auxiliary conductive lines 133 may be disposed to be adjacent to the outer sidewalls of the active pillars 100p and may extend in the second direction, y. In an exemplary embodiment in accordance with principles of inventive concepts, main conductive lines 153 may be disposed in recessed regions 100r. Main conductive lines 153 may be substantially parallel with auxiliary conductive lines 133 and may be disposed to cross active patterns 100a and first isolation patterns 115. That is, main conductive lines 153 may extend in the second direction, y, along sidewalls of the recessed regions 100r. The pair of adjacent main conductive lines 153 may be disposed between the pair of adjacent active pillars 100p included in each active pattern 100a.

Each of active patterns 100a may be located between a pair of adjacent auxiliary conductive lines 133. Because main conductive lines 153 are disposed in respective ones of the recessed regions 100r, planar areas occupied by main conductive lines 133 may be minimized. That is, a width (e.g., a distance along the first direction, s) of each of main conductive lines 153 may not be directly limited by a resolution limit of a photolithography process. Each of main conductive lines 153 may include opposing first and second sidewalls. The first sidewall of main conductive line 153 may be adjacent to active pillar 100p, and second sidewall of main conductive line 153 may be adjacent to a separating insulation pattern.

The separating insulation pattern may be disposed in each of the second trenches 104 to insulate the pair of main conductive lines 153 from each other. The separating insulation pattern may include a pair of first sidewall spacers 141 covering inner sidewall of upper portions of pair of adjacent active pillars 100p, a pair of second sidewall spacers 143 covering the second sidewalls of pair of adjacent main conductive lines 153, and a filling insulation pattern 145 disposed between pair of second sidewall spacers 143. The first and second sidewall spacers 141 and 143 may extend in the second direction, y. The pair of second sidewall spacers 143 in second trench 104 may extend along a bottom surface of second trench 104 to be connected to each other, for example, as illustrated in a right cross sectional view of FIG. 2. As a result, the separating insulation pattern may be disposed between pair of active pillars 100p to extend in the second direction, y. In an exemplary embodiment in accordance with principles of inventive concepts, the first sidewall of main conductive line 153 may have a rounded profile, and second sidewall of main conductive line 153 may be vertically self-aligned with the inner sidewall of active pillar 100p on recessed region 100r.

Top surfaces of auxiliary conductive lines 133 and main conductive lines 153 may be located at a lower level than top surfaces of active pillars 100p. The auxiliary conductive lines 133 may be located at a lower level than main conductive lines 153. For example, top surfaces of auxiliary conductive lines 133 may be located at a lower level than top surfaces of and main conductive lines 153.

In an exemplary embodiment in accordance with principles of inventive concepts, auxiliary conductive lines 133 may be insulated from semiconductor substrate 100 by a buffer insulation layer 131. A gate insulation layer 151 may be disposed between main conductive lines 153 and active patterns 100a. The buffer insulation layer 131 and gate insulation layer 151 may be formed of an oxide material, a nitride material and/or an oxynitride material.

In an exemplary embodiment in accordance with principles of inventive concepts, a conductivity type of auxiliary conductive lines 133 may be opposite to that of main conductive lines 153. The auxiliary conductive lines 133 and main conductive lines 153 may include at least one of a doped semiconductor material (e.g., a doped silicon material or a doped germanium material), a conductive metal nitride material (e.g., a titanium nitride material or a tantalum nitride material), a metal material (e.g., a tungsten material, a titanium material or a tantalum material) and a metal-semiconductor compound material (e.g., a tungsten silicide material, a cobalt silicide material or a titanium silicide material).

In an exemplary embodiment in accordance with principles of inventive concepts, common contact plugs 163 may be disposed in second trenches 104. Each of common contact plugs 163 may penetrate filling insulation pattern 145 between pair of active pillars 100p included in each active pattern 100a to contact common impurity region 161. The second sidewall spacers 143 may be disposed between common contact plugs 163 and main conductive lines 153. The second sidewall spacers 143 may extend upwardly to intervene between common contact plugs 163 and upper impurity regions 165. As a result, each of filling insulation patterns 145 may be disposed between pair of common contact plugs 163 that are adjacent to each other in the second direction, y.

Common contact plugs 163 may upwardly protrude from topmost surfaces of active patterns 100a, for example, top surfaces of active pillars 100p. Second sidewall spacers 143 may also upwardly extend to cover sidewalls of protruded portions of common contact plugs 163. Filling insulation patterns 145 may upwardly extend from the top surfaces of active pillars 100p. Top surfaces of the protruded portions of common contact plugs 163, second sidewall spacers 143 and filling insulation patterns 145 may be coplanar with each other, for example.

Common contact plugs 163 may be formed of a conductive material. For example, each of common contact plugs 163 may include at least one of a doped semiconductor material (e.g., a doped silicon material or a doped germanium material), a conductive metal nitride material (e.g., a titanium nitride material or a tantalum nitride material), a metal material (e.g., a tungsten material, a titanium material or a tantalum material) and a metal-semiconductor compound material (e.g., a tungsten silicide material, a cobalt silicide material or a titanium silicide material). First and second sidewall spacers 141 and 143 may be formed of an oxide material, a nitride material and/or an oxynitride material, for example. Filling insulation patterns 145 may be formed of a dielectric material having an etch selectivity with respect to first and second sidewall spacers 141 and 143. For example, if first and second sidewall spacers 141 and 143 include a nitride material and/or an oxynitride material, filling insulation patterns 145 may be formed of an oxide material. Alternatively, if first and second sidewall spacers 141 and 143 include an oxide material, filling insulation patterns 145 may be formed of a nitride material and/or an oxynitride material, for example.

A first interlayer insulation layer 170 may be disposed on active patterns 100a and first and second isolation patterns 115 and 135. First interlayer insulation layer 170 may have a planarized top surface that is coplanar with top surfaces of common contact plugs 163. In an exemplary embodiment in accordance with principles of inventive concepts, first interlayer insulation layer 170 may be formed of a dielectric material having an etch selectivity with respect to filling insulation patterns 145. First interlayer insulation layer 170 may be formed of the same material as first and second sidewall spacers 141 and 143.

Common conductive lines 171 may be disposed on first interlayer insulation layer 170. Common conductive lines 171 may be disposed to cross over active patterns 100a. The common conductive lines 171 may extend in a third direction perpendicular to the second direction, y. The third direction may correspond to a direction indicated by an arrow "x" illustrated in a plan view of FIG. 1. In an exemplary embodiment in accordance with principles of inventive concepts, common conductive lines 171 may extend in a different direction from the third direction, x.

In an exemplary embodiment in accordance with principles of inventive concepts, each of common conductive lines 171 may be electrically connected to common contact plugs 163 arrayed in a row that is parallel with the third direction, x. Capping insulation patterns 173 may be stacked on respective ones of common conductive lines 171, and spacers may be respectively disposed on sidewalls of stack patterns including capping insulation patterns 173 and common conductive lines 171. Each of common conductive lines 171 may include at least one of a conductive metal nitride material (e.g., a titanium nitride material or a tantalum nitride material), a metal material (e.g., a tungsten material, a titanium material or a tantalum material) and a metal-semiconductor compound material (e.g., a tungsten silicide material, a cobalt silicide material or a titanium silicide material).

A second interlayer insulation layer 180 may be disposed on first interlayer insulation layer 170. Second interlayer insulation layer 180 may fill spaces between stack patterns including capping insulation patterns 173 and common conductive lines 171. The second interlayer insulation layer 180 may have a planarized top surface that is coplanar with top surfaces of capping insulation patterns 173. Alternatively, second interlayer insulation layer 180 may cover the top surfaces of capping insulation patterns 173.

Data storage elements 190 may be disposed on second interlayer insulation layer 180. The data storage elements 190 may be electrically connected to respective ones of upper impurity regions 165 though contact plugs 181 that penetrate first and second interlayer insulation layers 170 and 180. Each contact plug 181 may include a conductive material. Data storage elements 190 may have one of various forms. For example, data storage elements 190 may implemented with a capacitor or a variable resistor.

According to exemplary embodiments in accordance with principles of inventive concepts described above, an electric potential of active pillar 100p adjacent to recessed region 100r may be controlled by an electric bias applied to main conductive line 153 disposed in recessed region 100r. That is, the electric bias applied to main conductive line 153 may control the electric potential of active pillar 100p (e.g., a vertical channel) between upper impurity region 165 and common impurity region 161. Electric biases may be independently applied to main conductive lines 153. One of main conductive lines 153, upper impurity region 165 adjacent to main conductive line 153, and common impurity region 161 adjacent to main conductive line 153 may constitute a single field effect transistor, that is, for example, a single MOS transistor. In an exemplary embodiment in accordance with principles of inventive concepts, one of active patterns 100a may include pair of active pillars 100p, and one of common impurity regions 161 may be located under pair of active pillars 100p. In such an exemplary embodiment, each of active patterns 100a may provide a pair of field effect transistors sharing single common impurity region 161. Each of the field effect transistors may be used as a switching element of a memory cell including one of data storage elements 190, for example.

In an exemplary embodiment in accordance with principles of inventive concepts, upper impurity regions 165, common impurity regions 161, active pillars 100p between upper impurity regions 165 and common impurity regions 161, and main conductive lines 153 may constitute n-channel MOS transistors, and auxiliary conductive lines 133, active pillars 100p adjacent to recessed regions 100r, common impurity regions 161, and semiconductor substrate 100 may constitute p-channel MOS transistors.

If feature sizes decrease and the integration density of semiconductor devices increases, common impurity regions 161 could occupy a relatively larger area, resulting a profile indicated by reference designator 161e, as illustrated in FIG. 2. That is, as feature sizes decrease, enlarged common impurity regions 161e could electrically isolate active pillars 100p adjacent to recessed regions 100r from semiconductor substrate 100. In such cases, active pillars 100p adjacent to recessed regions 100r could be floated and, as result, holes could be accumulated in active pillars 100p (e.g., vertical channel regions) to cause unstable operation of n-channel MOS transistors. Instability may take the form, for example, of n-channel MOS transistors exhibiting a kink effect relating to a floating body effect. The end result could be drain leakage current of n-channel MOS transistors degrading dynamic refresh characteristic of the semiconductor device.

However, in an exemplary embodiment in accordance with principles of inventive concepts, even though the common impurity regions 161e are formed to isolate active pillars 100p from semiconductor substrate 100, inversion layers between active pillars 100p and semiconductor substrate 100 may be formed by applying a lower bias than semiconductor substrate 100 to auxiliary conductive lines 133. For example, when semiconductor substrate 100 is grounded, a negative voltage may be applied to auxiliary conductive lines 133 to solve the floating body effect of p-channel MOS transistors. In this manner, the holes accumulated in active pillars 100p may be drifted into semiconductor substrate 100 through the inversion layers.

The following exemplary embodiments are similar to the previous embodiment described in the discussion related to FIGS. 2 and 3. Differences between the previous exemplary embodiment and the following exemplary embodiments will be mainly described hereinafter.

Figure 4:
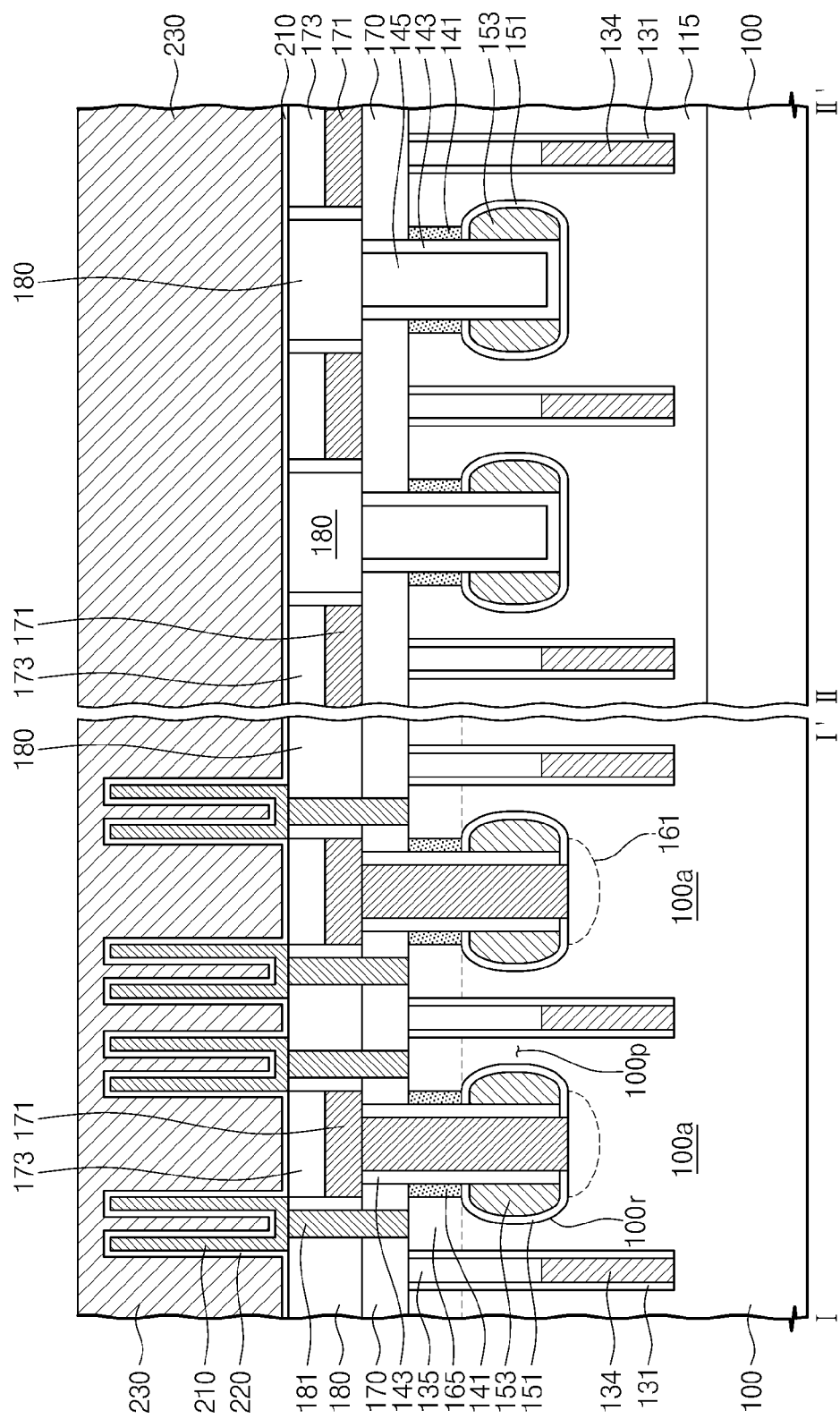
FIG. 4 is a merged cross sectional view taken along lines I-I' and II-II' of FIG. 1 to illustrate auxiliary conductive lines of an exemplary embodiment of a semiconductor device in accordance with principles of inventive concepts.

FIG. 4 is a merged cross sectional view taken along lines I-I' and II-II' of FIG. 1 to illustrate auxiliary conductive lines of an exemplary embodiment of a semiconductor device in accordance with principles of inventive concepts.

Referring to FIG. 4, the present exemplary embodiment in accordance with principles of inventive concepts may be different from the previous exemplary embodiment illustrated in FIGS. 2 and 3 in terms of a configuration of auxiliary conductive lines 134. That is, auxiliary conductive lines 134 of the present exemplary embodiment may directly contact semiconductor substrate 100. In an exemplary embodiment in accordance with principles of inventive concepts, semiconductor substrate 100 may have a first conductivity type, and auxiliary conductive lines 134 may be formed of a semiconductor material doped with impurities of the first conductivity type. In this exemplary embodiment auxiliary conductive lines 134 under second isolation patterns 135 may be electrically and directly connected to semiconductor substrate 100. According to the present exemplary embodiment, each of data storage elements 190 may include a capacitor. The capacitor may include a storage electrode 210, a capacitor dielectric layer 220 and a top electrode 230.

Storage electrodes 210 may be electrically connected to contact plugs 181. Each of storage electrodes 210 may have a three dimensional structure (e.g., a cylindrical structure) for increasing a surface area thereof. Capacitor dielectric layer 220 may be disposed to a uniform thickness on the surfaces of storage electrodes 210. Top electrodes 230 may be disposed on capacitor dielectric layer 220 to overlap with storage electrodes 210.

In another exemplary embodiment, each of data storage elements 190 may include, for example, a variable resistor. The variable resistors may be electrically connected to contact plugs 181. The variable resistors may be changeable into any one of a plurality of stable states, each having electrical resistances distinguishable from each other. Each of the variable resistors may include a magnetic tunnel junction pattern, a phase change material pattern, or a resistive material in which a conductive filament can be generated or removed, for example.

Figure 5:
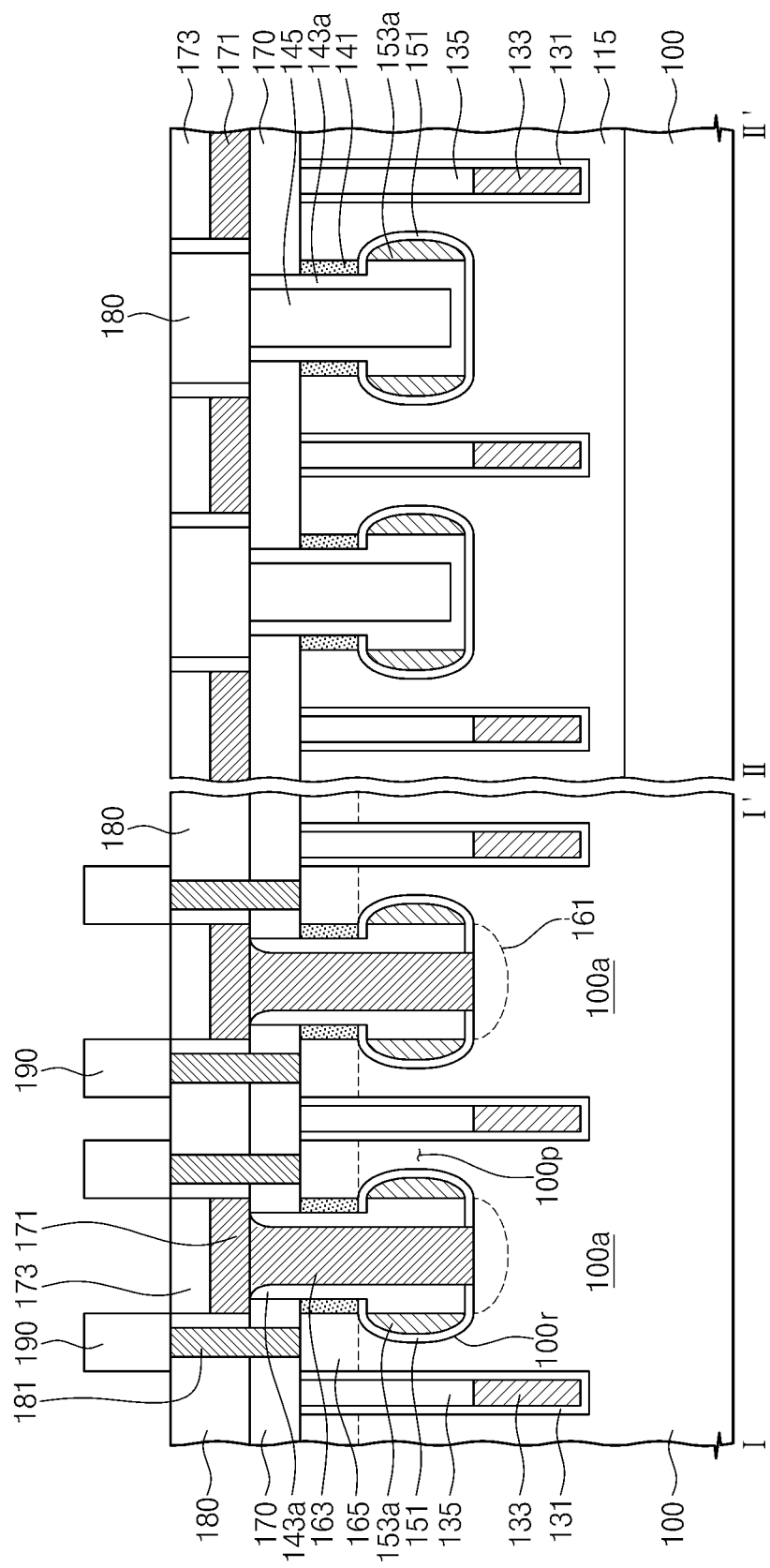
FIG. 5 is a merged cross sectional view taken along lines I-I' and II-II' of FIG. 1 to illustrate main conductive lines of an exemplary embodiment of a semiconductor device in accordance with principles of inventive concepts.
Figure 6:
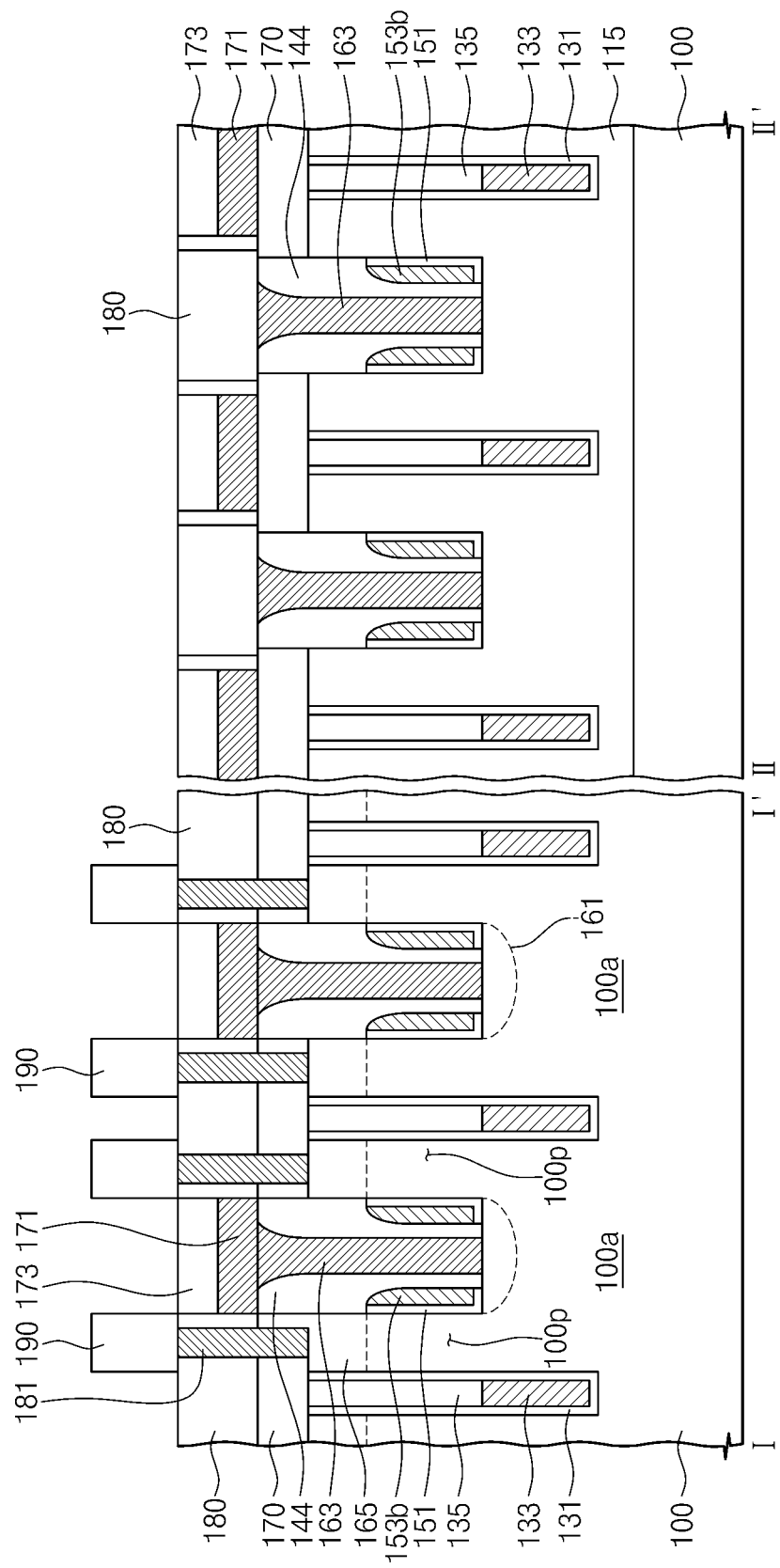
FIG. 6 is a merged cross sectional view taken along lines I-I' and II-II' of FIG. 1 to illustrate main conductive lines of an exemplary embodiment of a semiconductor device in accordance with principles of inventive concepts.

FIGS. 5 and 6 are merged cross sectional view taken along lines I-I' and II-II' of FIG. 1 to illustrate main conductive lines of semiconductor devices according to some exemplary embodiments.

Referring to FIG. 5, a pair of main conductive lines 153a may be disposed in a pair of recessed regions 100r located in each of active patterns 100a. That is, main conductive lines 153a may cross active patterns 100a. The pair of main conductive lines 153a may be symmetrical with respect to a vertical axis passing through a central point of second trench 104, for example. Each of main conductive lines 153a may include a first sidewall adjacent to active pillar 100p and a second sidewall adjacent to common contact plug 163. In an exemplary embodiment in accordance with principles of inventive concepts, the second sidewalls of main conductive lines 153a may be laterally recessed from the inner sidewalls of active pillars 100p. That is, each of main conductive lines 153a may fill only a portion of the corresponding recessed region 100r.

Second sidewall spacers 143a may be disposed between main conductive lines 153a and common contact plug 163. Each of second sidewall spacers 143a may fill a portion of each of recessed regions 100r. A lower width of second sidewall spacers 143a may be greater than an upper width of second sidewall spacers 143a.

According to an exemplary embodiment illustrated in FIG. 5, the width of main conductive lines 153a may be less than the width of main conductive lines 153 illustrated in FIG. 2. That is, the distance between main conductive lines 153a and common contact plug 163 may be greater than in the exemplary embodiment illustrated in FIG. 2. As a result, in this exemplary embodiment, a parasitic capacitance between main conductive lines 153a and common contact plug 163 could be reduced.

The exemplary embodiment in accordance with principles of inventive concepts illustrated in FIG. 6 is different from the exemplary embodiment described in the discussion related to FIGS. 2 and 3 in terms of configurations of active pillars and main conductive lines.

Referring to FIG. 6, each of active pillars 100p'extending from semiconductor substrate 100 may have substantially a uniform width. A pair of main conductive lines 153b may be disposed between a pair of adjacent active pillars 100p' included in each of active patterns 100a. Each of main conductive lines 153b may be disposed on an inner sidewall of any one of active pillars 100p', and a gate insulation layer 151 may be disposed between main conductive lines 153b and active pillars 100p'. In an exemplary embodiment in accordance with principles of inventive concepts, each of main conductive lines 153b may cover a lower inner sidewall of any one of active pillars 100p'. The main conductive lines 153b may extend in the second direction, y. Each of main conductive lines 153b take the form of a sidewall spacer, for example. The pair of main conductive lines 153b disposed in each of active patterns 100a may be symmetrical with respect to a vertical axis passing through a central point of second trench 104 between pair of active pillars 100p'.

Common impurity regions 161 may be disposed in respective ones of active patterns 100a under second trenches 104, and common contact plugs 163 may be electrically connected to common impurity regions 161.

Sidewall spacers 144 may be disposed between main conductive lines 153b and common contact plugs 163. Additionally, sidewall spacers 144 may extend to cover upper inner sidewalls of active pillars 100p'.

Figure 7:
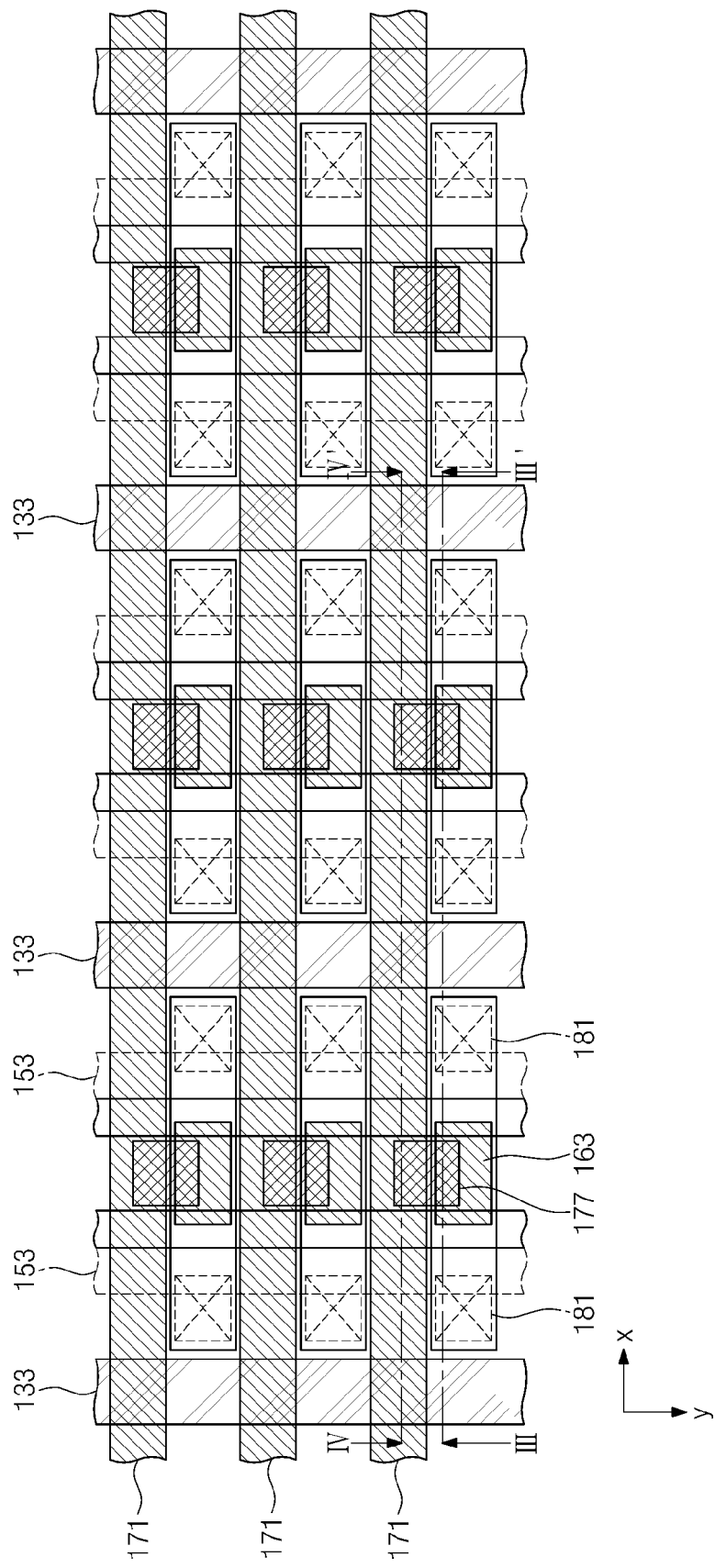
FIG. 7 is a plan view illustrating an exemplary embodiment of a semiconductor device in accordance with principles of inventive concepts.
Figure 8:
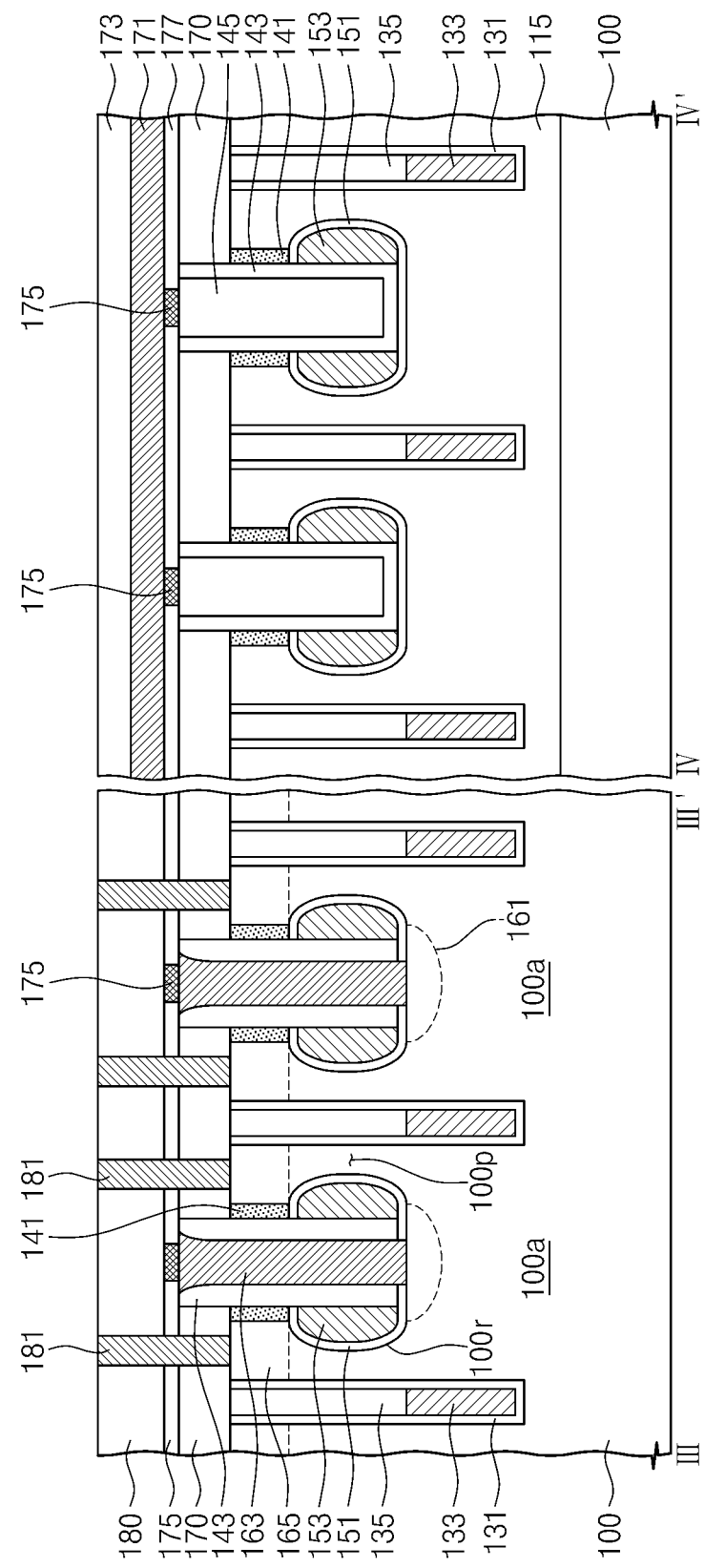
FIG. 8 is a merged cross sectional view taken along lines III-III' and IV-IV' of FIG. 7.

FIG. 7 is a plan view illustrating an exemplary embodiment of a semiconductor device in accordance with principles of inventive concepts, and FIG. 8 is a merged cross sectional view taken along lines III-III' and IV-IV' of FIG. 7.

Referring to FIGS. 7 and 8, a plurality of active patterns 100a may be two dimensionally arrayed along rows and columns on a semiconductor substrate 100. Each of active patterns 100a may have a rectangular shape that is parallel with a first direction. In the present embodiment, the first direction may correspond to a direction indicated by an arrow "x" illustrated in a plan view of FIG. 7.

Auxiliary and main conductive lines 133 and 153 may be disposed in semiconductor substrate 100 and may extend in a second direction perpendicular to the first direction. In an exemplary embodiment in accordance with principles of inventive concepts, the second direction may correspond to a direction indicated by an arrow "y" illustrated in a plan view of FIG. 7. First isolation patterns 115 may be disposed between active patterns 100a adjacent to each other in the second direction and may extend in the first direction. Second isolation patterns 135 may be disposed between active patterns 100a adjacent to each other in the first direction and may extend in the second direction. Auxiliary conductive lines 133 may be disposed under second isolation patterns 135 and may be parallel with the second direction.

Each of active patterns 100a may include a pair of active pillars 100p. A lower inner sidewall of each of active pillars 100p may be laterally recessed to provide a recessed region 100r, like the embodiment illustrated in FIG. 2. The main conductive lines 153 may be disposed in respective ones of recessed regions 100r, and a gate insulation layer 151 may be disposed between main conductive lines 153 and active pillars 100p.

According to an exemplary embodiment in accordance with principles of inventive concepts illustrated in FIGS. 7 and 8, common conductive lines 171 may be disposed to extend in the first direction. The common conductive lines 171 may be disposed over first isolation patterns 115. The common conductive lines 171 may be connected to common contact plugs 163 through conductive pads 177. Each conductive pads 177 may contact a top surface of one of common contact plugs 163 and may extend onto first isolation pattern 115 adjacent thereto. Each common conductive lines 171 may be electrically connected to conductive pads 177 extending onto any one of first isolation patterns 115. The conductive pads 177 may be disposed to penetrate an insulation layer 175 disposed between a first interlayer insulation layer 170 and a second interlayer insulation layer 180. A top surface of insulation layer 175 may be coplanar with top surfaces of conductive pads 177. Each of conductive pads 177 may include at least one of a doped semiconductor material (e.g., a doped silicon material or a doped germanium material), a conductive metal nitride material (e.g., a titanium nitride material or a tantalum nitride material), a metal material (e.g., a tungsten material, a titanium material or a tantalum material) and a metal-semiconductor compound material (e.g., a tungsten silicide material, a cobalt silicide material or a titanium silicide material), for example. Insulation layer 175 may be formed of an oxide material, a nitride material and/or an oxynitride material, for example.

Contact plugs 181 may penetrate first and second interlayer insulation layers 170 and 180 and insulation layer 175 to contact upper impurity regions 165, respectively. Data storage elements 190 may be disposed on contact plugs 181, as described in the discussion related to FIGS. 2 and 3.

Methods of manufacturing a semiconductor device according to exemplary embodiments will now be described.

FIGS. 9A to 18A are plan views illustrating an exemplary method of manufacturing a semiconductor device in accordance with principles of inventive concepts. FIGS. 9B to 18B are merged cross sectional views taken along lines I-I' and II-II' of FIGS. 9A to 18A, respectively, to illustrate an exemplary method of manufacturing a semiconductor device in accordance with principles of inventive concepts.

Figure 9A:
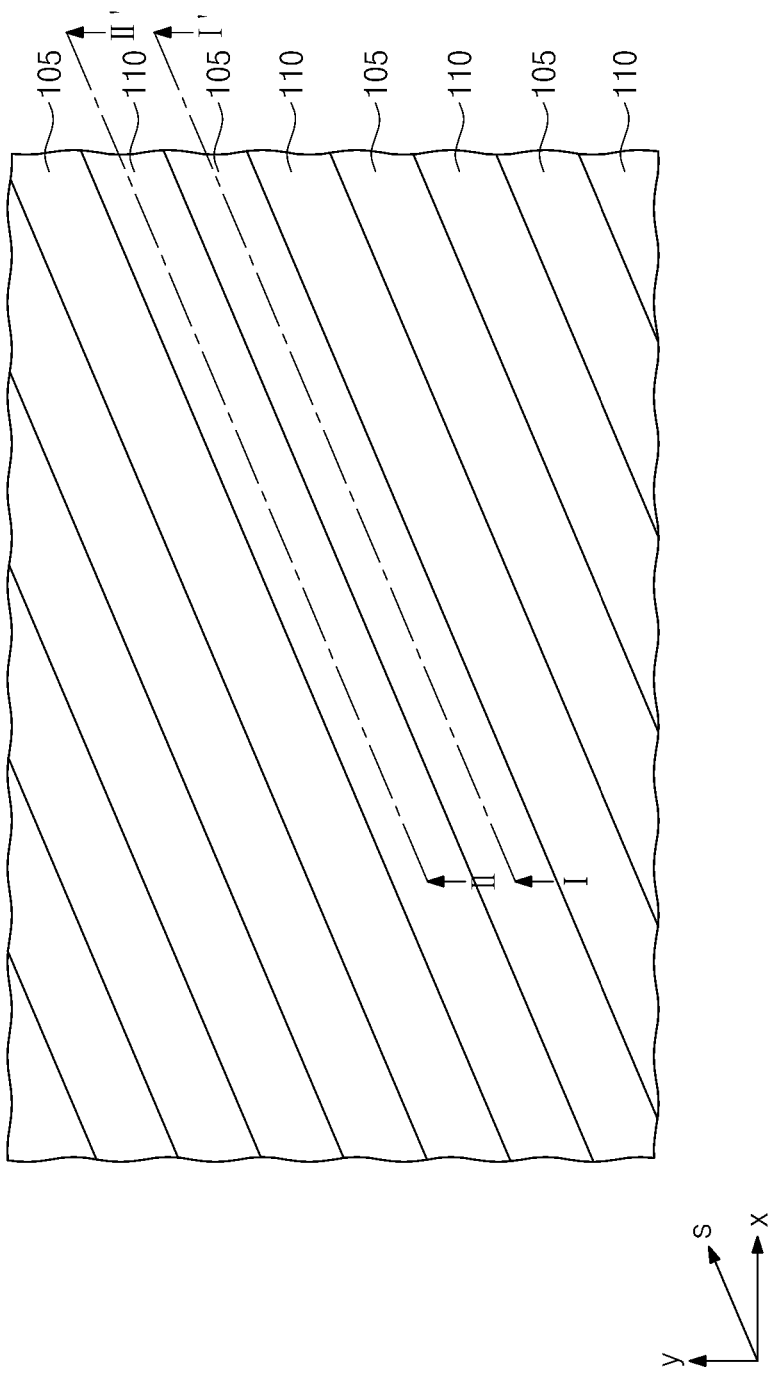
Figure 9B:
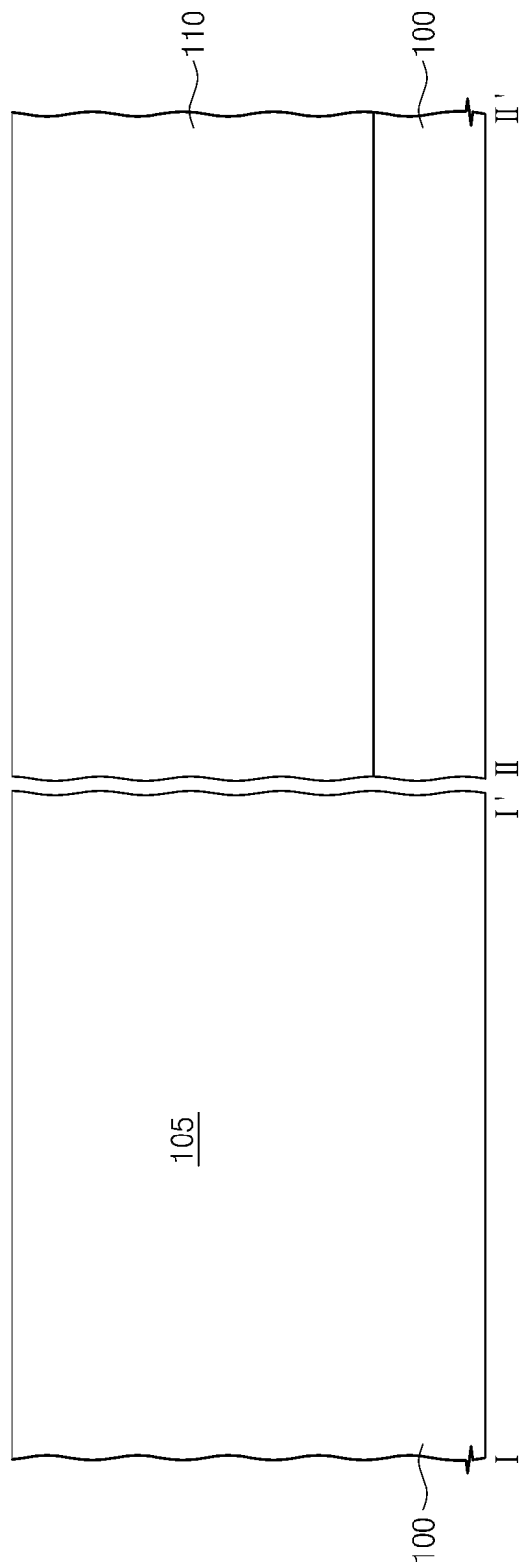

Referring to FIGS. 9A and 9B, isolation layers 110 defining preliminary active patterns 105 may be formed in a semiconductor substrate 100. Semiconductor substrate 100 may be a silicon substrate, a germanium substrate or a silicon-germanium substrate, for example.

In an exemplary embodiment in accordance with principles of inventive concepts, each of isolation layers 110 may be formed to have a line shape that is parallel with a first direction (e.g., a direction indicated by an arrow 's' shown in FIG. 9A), and preliminary active patterns 105 defined by isolation layers 110 may also be parallel with the first direction (e.g., the s-axis direction). The isolation layers 110 may be formed by forming a mask pattern (not shown) on semiconductor substrate 100, anisotropically etching semiconductor substrate 100 using the mask pattern as an etch mask to form trenches, and filing the trenches with an insulation material such as an oxide material or a nitride material, for example.

In an exemplary embodiment in accordance with principles of inventive concepts, isolation layers 110 may include a thermal oxide layer formed on sidewalls of the trenches. The isolation layers 110 may further include a liner layer formed on the thermal oxide layer. The liner layer may be formed of a nitride layer and/or an oxynitride layer. In addition, isolation layers 110 may further include a filling oxide layer that fills the trenches surrounded by the liner layer. The filling oxide layer may be formed to include a high density plasma (HDP) oxide layer and/or a spin on glass (SOG) layer, for example.

Figure 10A:
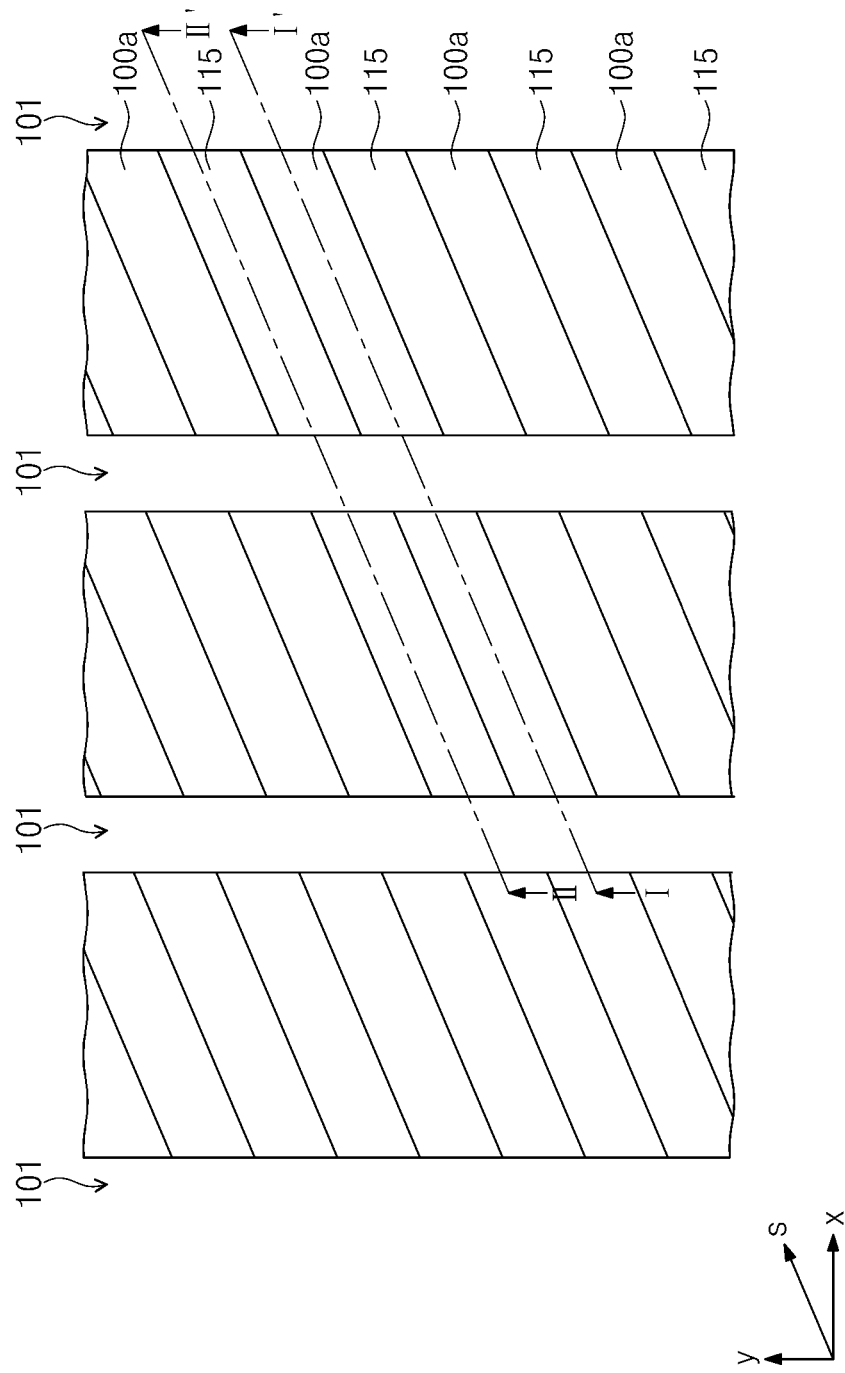
Figure 10B:
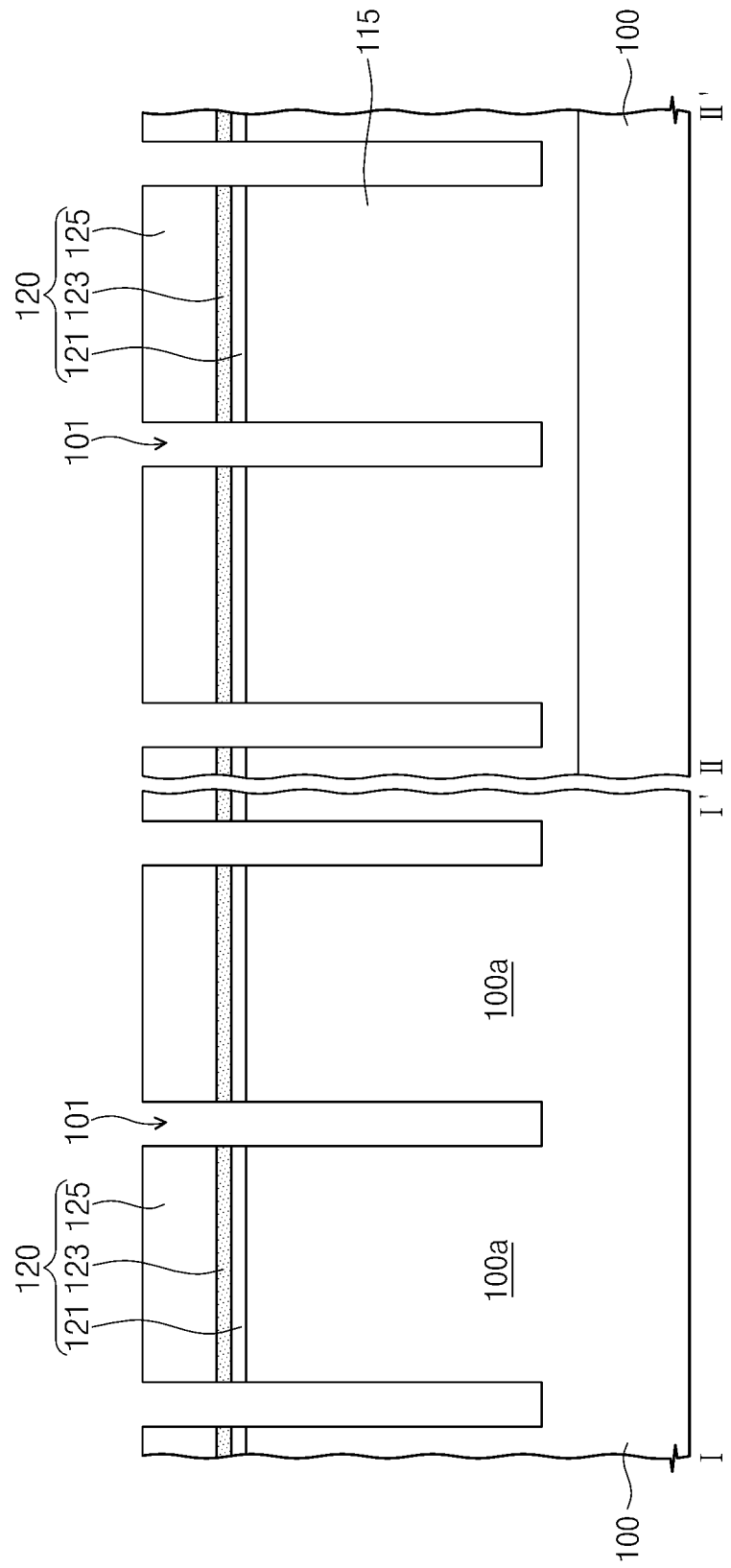

Referring to FIGS. 10A and 10B, first trenches 101 may be formed to cross preliminary active patterns 105 and isolation layers 110.

Forming first trenches 101 may include forming a hard mask layer 120 having openings on preliminary active patterns 105 and isolation layers 110, and anisotropically etching preliminary active patterns 105 and isolation layers 110 using hard mask layer 120 as an etch mask.

The openings in hard mask layer 120 may cross over preliminary active patterns 105 and isolation layers 110. The openings may extend in a second direction (e.g., a y-axis direction shown in FIG. 10A) that is non-parallel with the first direction, thereby crossing over preliminary active patterns 105 and isolation layers 110. That is, the openings may expose portions of preliminary active patterns 105 and isolation layers 110.

The hard mask layer 120 may include a material having an etch selectivity with respect to preliminary active patterns 105 and isolation layers 110. For example, hard mask layer 120 may be formed of an oxide layer, a nitride layer and/or an oxynitride layer. In an exemplary embodiment in accordance with principles of inventive concepts, hard mask layer 120 may be formed by stacking a pad insulation layer 121, an etch stop layer 123 and a mask layer 125 on preliminary active patterns 105 and isolation layers 110. For example, pad insulation layer 121 and mask layer 125 may be formed of a silicon oxide layer, and etch stop layer 123 may be formed of a silicon nitride layer.

First trenches 101 may be formed to extend in a second direction (e.g., the y-axis direction) that is non-parallel with preliminary active patterns 105 and isolation layers 110. First trenches 101 may split each of preliminary active patterns (105 of FIG. 9A) into a plurality of active patterns 100a. Similarly, first trenches 101 may split each of isolation layers (110 of FIG. 9A) into a plurality of first isolation patterns 115. Active patterns 100a and first isolation patterns 115 may be two-dimensionally arrayed along rows and columns, as illustrated in the plan view of FIG. 10A. Each active patterns 100a may have a rectangular shape (or a bar shape) that is parallel with a first direction. Similarly, each of first isolation patterns 115 may have a rectangular shape (or a bar shape) that is parallel with a first direction.

First trenches 101 may be formed to be shallower than first isolation patterns 115. That is, bottom surfaces of first trenches 101 may be located at a higher level than bottom surfaces of first isolation patterns 115.

Figure 11A:
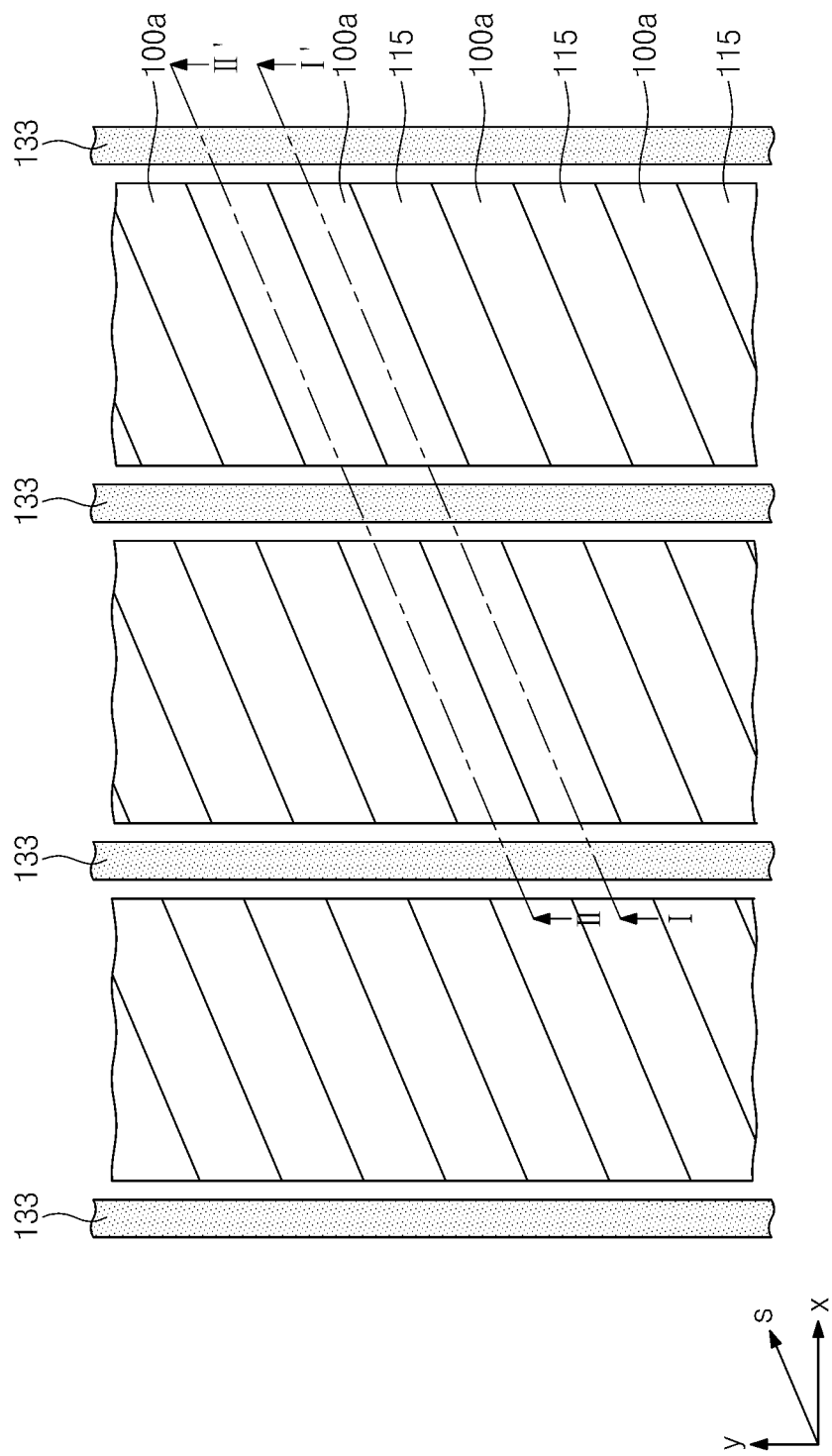
Figure 11B:
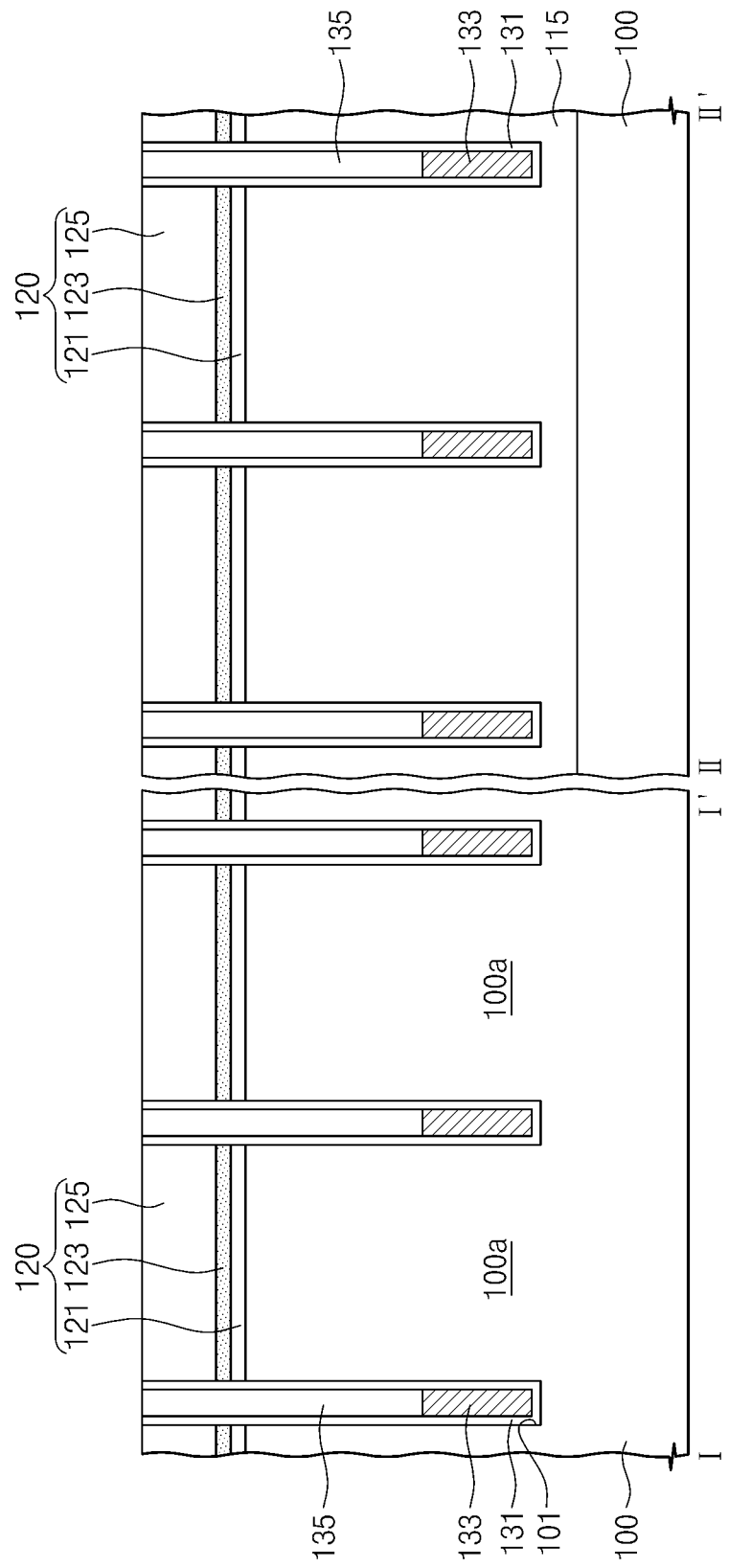

Referring to FIGS. 11A and 11B, auxiliary conductive lines 133 may be formed in first trenches 101. A buffer insulation layer 131 may be formed to intervene between auxiliary conductive lines 133 and inner surfaces of first trenches 101.

Buffer insulation layer 131 may be formed to a uniform thickness along the inner surfaces of first trenches 101. Buffer insulation layer 131 may be formed of a thermal oxide layer, for example. Alternatively, buffer insulation layer 131 may be formed to include at least one of an oxide material, a nitride material, an oxynitride material and a high-k dielectric material (e.g., a hafnium oxide layer or an aluminum oxide layer), for example.

Auxiliary conductive lines 133 may be formed by forming a first conductive layer on buffer insulation layer 131 to fill first trenches 101 and etching first conductive layer to expose hard mask layer 120. First conductive layer may be overetched so that auxiliary conductive lines 133 are recessed in first trenches 101. Top surfaces of auxiliary conductive lines 133 may be lower than a top surface of semiconductor substrate 100. That is, auxiliary conductive lines 133 may be formed by leaving portions of first conductive layer in lower regions of first trenches 101, for example.

The first conductive layer may be formed using an atomic layer deposition (ALD) process or a chemical vapor deposition (CVD) process, for example. The first conductive layer may be formed of a doped semiconductor material, for example, a doped silicon material, a doped germanium material and/or a doped silicon-germanium material. Alternatively, the first conductive layer may be formed of a conductive metal nitride material, a metal material or a metal silicide material, for example.

Meanwhile, prior to formation of the first conductive layer, buffer insulation layer 131 may be anisotropically etched to expose bottom surfaces of first trenches 101. In this case, auxiliary conductive lines 134 directly contacting semiconductor substrate 100 may be formed, as illustrated in FIG. 4.

Second isolation patterns 135 may be formed in first trenches 101 on auxiliary conductive lines 133 or 134. Second isolation patterns 135 may be formed by depositing an insulation layer filing first trenches 101 on auxiliary conductive lines 133 or 134 and planarizing the insulation layer to expose the a top surface of hard mask layer 120. That is, second isolation patterns 135 may also fill the openings that penetrate hard mask layer 120. Second isolation patterns 135 may upwardly and relatively protrude from a top surface of semiconductor substrate 100.

In an exemplary embodiment in accordance with principles of inventive concepts, second isolation patterns 135 may be formed of a material having an etch selectivity with respect to mask layer 125. For example, second isolation patterns 135 may be formed of a nitride layer and/or an oxynitride layer.

Referring to FIGS. 12A, 12B, 13A and 13B, second trenches 104 may be formed between first trenches 101 (or between second isolation patterns 135). Second trenches 104 may be formed to be substantially parallel with first trenches 101. Each of second trenches 104 may define a pair of separated active pillars 100p between pair of adjacent second isolation patterns 135.

Forming second trenches 104 may include forming hard mask spacers 140 on both sidewalls of each of protruded second isolation patterns 135, anisotropically etching active patterns 100a and first isolation layers 115 using hard mask spacers 140 as etch masks to form preliminary trenches 102, forming first sidewall spacers 141 on inner sidewalls of preliminary trenches 102, and anisotropically etching active patterns 100a and first isolation layers 115 using hard mask spacers 140 and first sidewall spacers 141 as etch masks to form second trenches 104 downwardly extending from preliminary trenches 102.

In more detail, after formation of second isolation patterns 135, mask layer 125 may be removed using an isotropic etching process or an anisotropic etching process. Removal of mask layer 125 may result in exposure of a top surface of etch stop layer 123 and exposure of sidewalls of protruded second isolation patterns 135. During removal of mask layer 125, portions of buffer insulation layer 131, which are located in the openings, may also be removed.

Figure 12A:
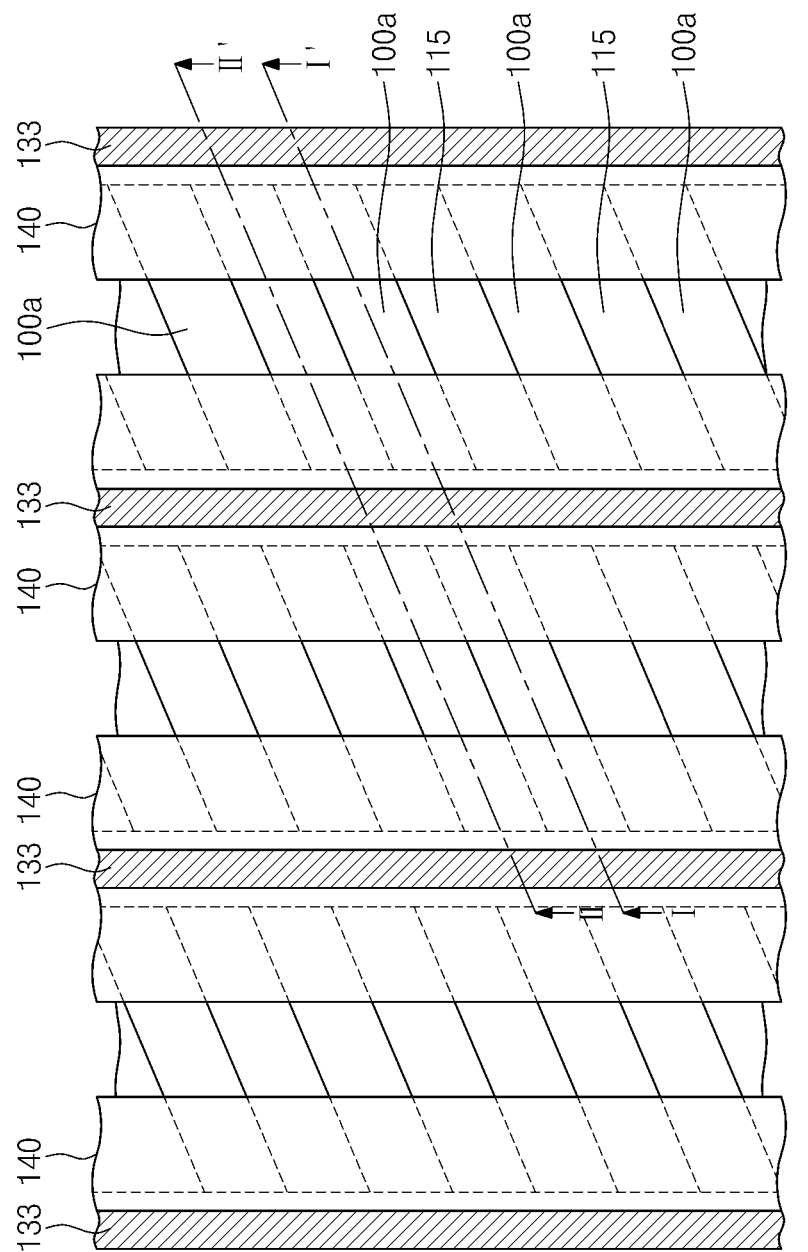
Figure 12B:
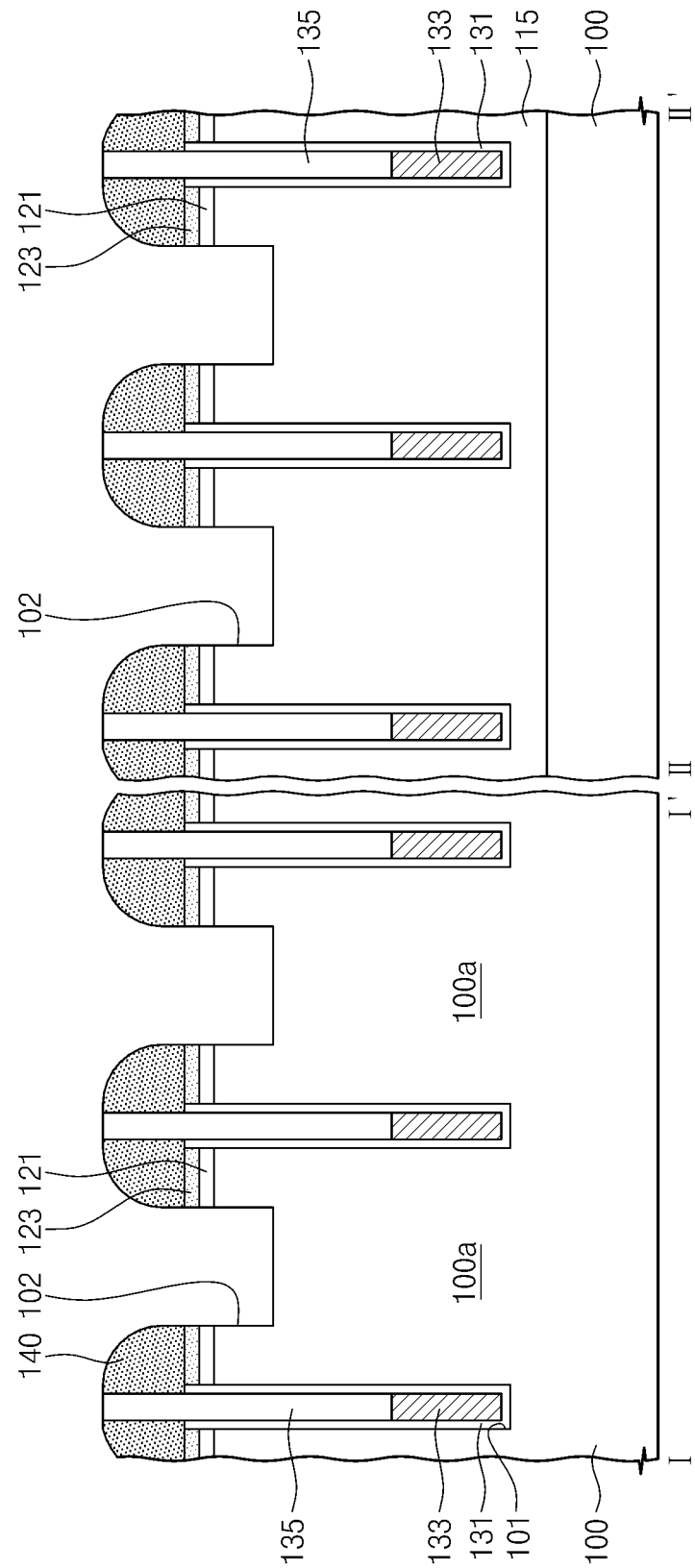

Referring still to FIGS. 12A and 12B, hard mask spacers 140 may be formed on both sidewalls of each of protruded second isolation patterns 135.

The hard mask spacers 140 may be formed to extend in the second direction, like second isolation patterns 135. After formation of hard mask spacers 140, central portions of active patterns 100a and first isolation layers 115 may be exposed. In an exemplary embodiment in accordance with principles of inventive concepts, hard mask spacers 140 may be formed of a material having an etch selectivity with respect to active patterns 100a and first isolation patterns 115. Additionally, hard mask spacers 140 may be formed of the same material as second isolation patterns 135. For example, hard mask layer 120 may be formed of an oxide layer, a nitride layer and/or an oxynitride layer.

In an exemplary embodiment in accordance with principles of inventive concepts, forming hard mask spacers 140 may include conformally forming a hard mask spacer layer on the substrate where mask layer 125 is removed, and anisotropically etching the hard mask spacer layer to expose top surfaces of first isolation patterns 115 and active patterns 100a. The hard mask spacer layer may be formed of a single-layered material or a multi-layered material. For example, the hard mask spacer layer may be formed by sequentially stacking an oxide layer and a nitride layer.

The hard mask spacer layer may be conformally deposited on the substrate, including protruded second isolation patterns 135, using a chemical vapor deposition (CVD) process. The width of preliminary trenches 102 may be varied according to a thickness of hard mask spacer layer.

The first isolation patterns 115 and active patterns 100a may be etched using hard mask spacers 140 as etch masks to form preliminary trenches 102 crossing first isolation patterns 115 and active patterns 100a.

The preliminary trenches 102 may be formed to cross central regions of active patterns 100a. Additionally, preliminary trenches 102 may be formed in the central portions of regions between adjacent second isolation patterns 135. Preliminary trenches 102 may be formed to extend in the second direction.

Figure 13A:
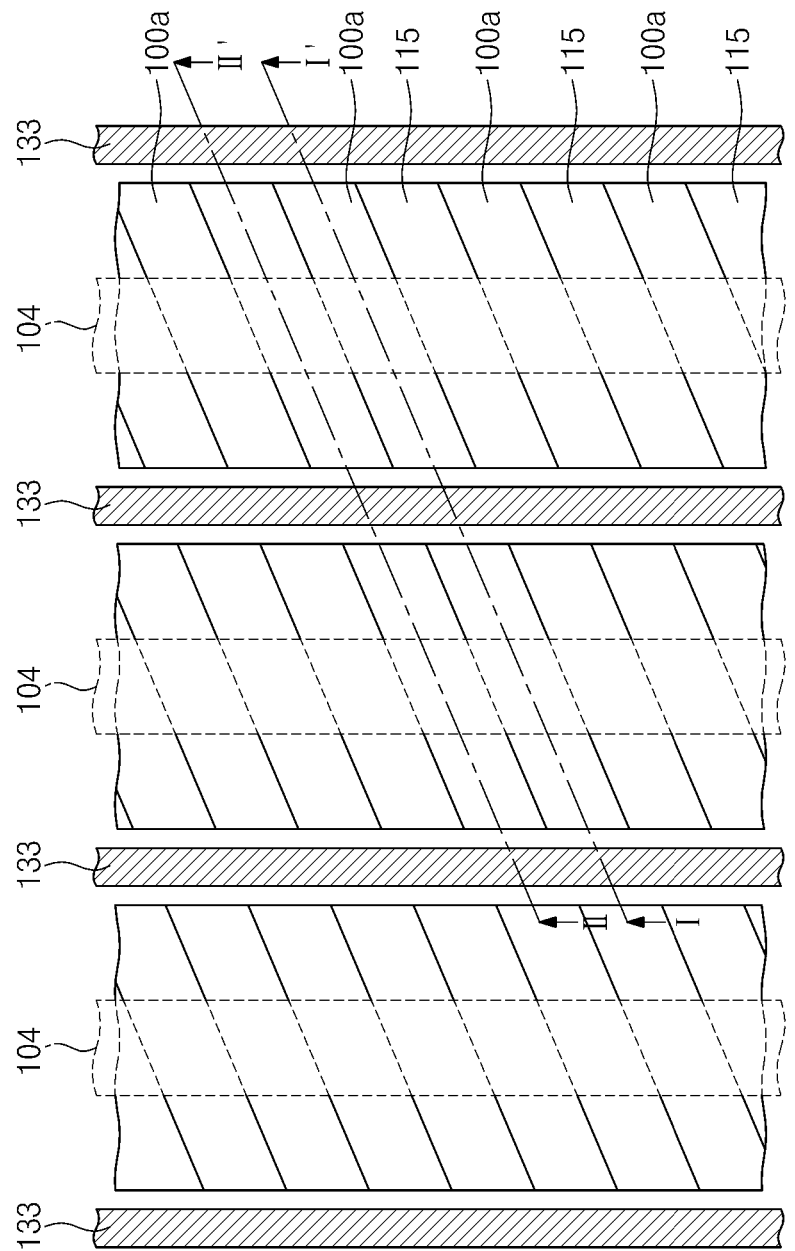
Figure 13B:
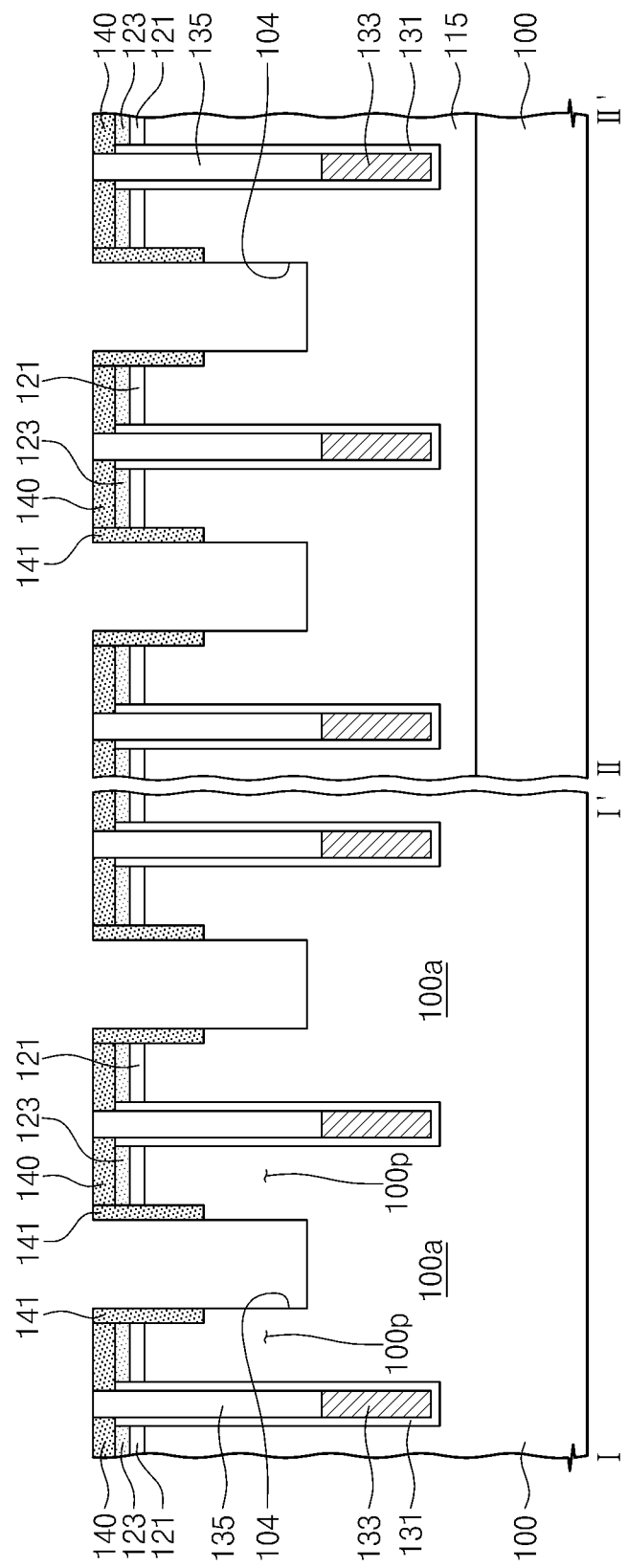

Subsequently, first sidewall spacers 141 may be formed on inner sidewalls of preliminary trenches 102, as illustrated in FIGS. 13A and 13B. Forming first sidewall spacers 141 may include conformally forming a spacer layer on the substrate where the preliminary trenches 102 are formed, and anisotropically etching the spacer layer to expose bottom surfaces of preliminary trenches 102. The spacer layer may be formed of a single-layered material or a multi-layered material. For example, the spacer layer may be formed of an oxide layer, a nitride layer and/or an oxynitride layer.

Referring still to FIGS. 13A and 13B, second trenches 104 may be formed by etching active patterns 100a under preliminary trenches 102 using first sidewall spacers 141 and hard mask spacers 140 as etch masks. In an exemplary embodiment in accordance with principles of inventive concepts, bottom surfaces of second trenches 104 may be located at a higher level than bottom surfaces of first trenches 101. That is, second trenches 104 may be formed to be shallower than first trenches 101.

Formation of second trenches 104 may result in formation of active pillars 100p extending from semiconductor substrate 100 between adjacent second isolation patterns 135. Each of second trenches 104 may be defined by the opposing inner sidewalls of the pair of active pillars 100p between adjacent second isolation patterns 135. A horizontal width (e.g., a distance along the first direction) of active pillars 100p may depend on a width of hard mask spacers 140. That is, the pair of active pillars 100p included in each of active patterns 100a may have substantially the same width.

Figure 14A:
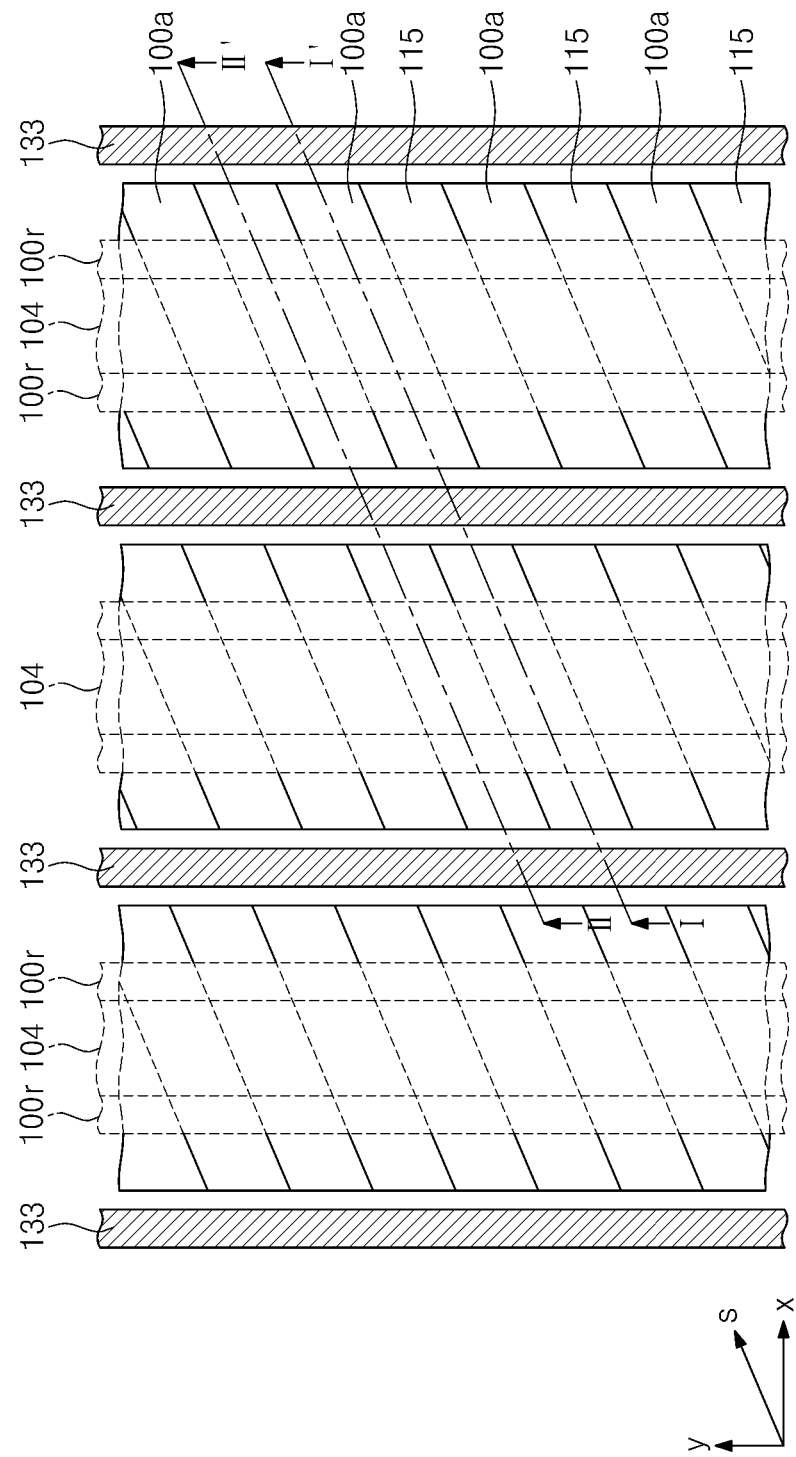
Figure 14B:
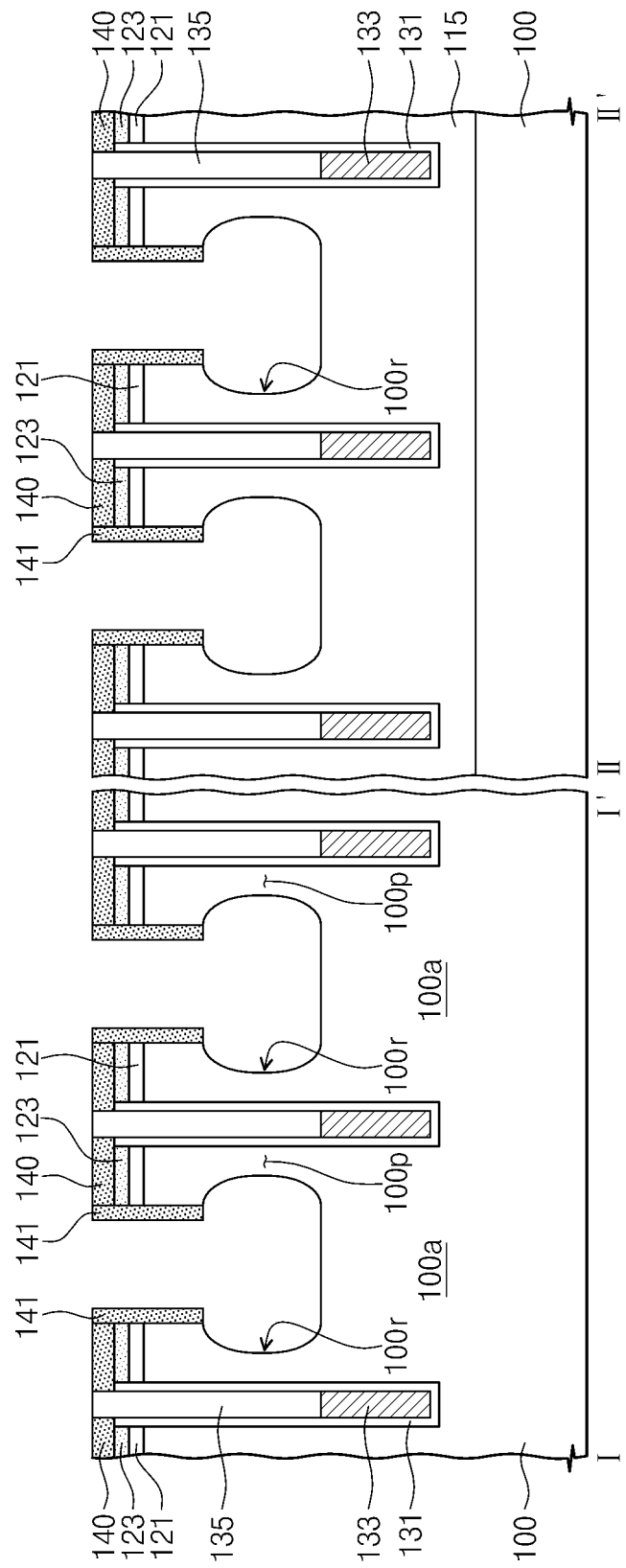

Referring to FIGS. 14A and 14B, lower inner sidewalls of active pillars 100p may be laterally etched using hard mask spacers 140 and first sidewall spacers 141 as etch masks to form a pair of recessed regions 100r in each of second trenches 104. The pair of recessed regions 100r in each of second trenches 104 may be symmetrical with respect to a vertical axis passing through a central point of second trench 104.

In an exemplary embodiment in accordance with principles of inventive concepts, forming the recessed regions 100r may include a first recessing process and a second recessing process. The first recessing process may correspond to a process for laterally etching the lower inner sidewalls of active pillars 100p exposed by second trenches (104 of FIGS. 13A and 13B). The first recessing process may be performed using an isotropic etching process, for example, a wet etching process. The second recessing process may correspond to a process for laterally etching first isolation patterns 115 exposed by second trenches (104 of FIGS. 13A and 13B). The second recessing process may also be performed using an isotropic etching process, for example, a wet etching process. The second recessing process may be performed after the first recessing process. Alternatively, the second recessing process may be performed prior to the first recessing process.

In the event that first isolation patterns 115 are formed of a multi-layered material, the second recessing process may include a plurality of sub-recessing processes. For example, when first isolation patterns 115 is formed to include a thermal oxide layer (not shown) and a liner layer (not shown), the second recessing process may include a first sub-recessing process and a second sub-recessing process. The first sub-recessing process may laterally etch the thermal oxide layer exposed by second trenches 104, and the second sub-recessing process may laterally etch the liner layer exposed by second trenches 104. Each of the first and second sub-recessing processes may be performed using an isotropic etching process. In the event that first isolation patterns 115 are formed of a multi-layered material, first sidewall spacers 141 may be formed of a double layered material.

In an exemplary embodiment in accordance with principles of inventive concepts, the first and second recessing processes may be performed so that a recessed depth (e.g., a width in the first direction) of recessed regions 100r formed in first isolation patterns 115 by the second recessing process is substantially equal to a recessed depth (e.g., a width in the first direction) of recessed regions 100r formed in active patterns 100a by the first recessing process. In this manner, recessed regions 100r may be formed to extend in the second direction.

Alternatively, the first and second recessing processes may be performed so that a recessed depth (e.g., a width in the first direction) of recessed regions 100r formed in first isolation patterns 115 by the second recessing process is greater than a recessed depth (e.g., a width in the first direction) of the recessed regions 100r formed in active patterns 100a by the first recessing process.

During the first and second recessing processes, the inner sidewalls of preliminary trenches 102 may be protected by first sidewall spacers 141. In this manner, a lower width of each of second trenches 104 may be greater than an upper width thereof.

In an exemplary embodiment in accordance with principles of inventive concepts, after performing the first and second recessing processes, first sidewall spacers 141 may be removed to expose sidewalls of preliminary trenches 102.

Figure 15A:
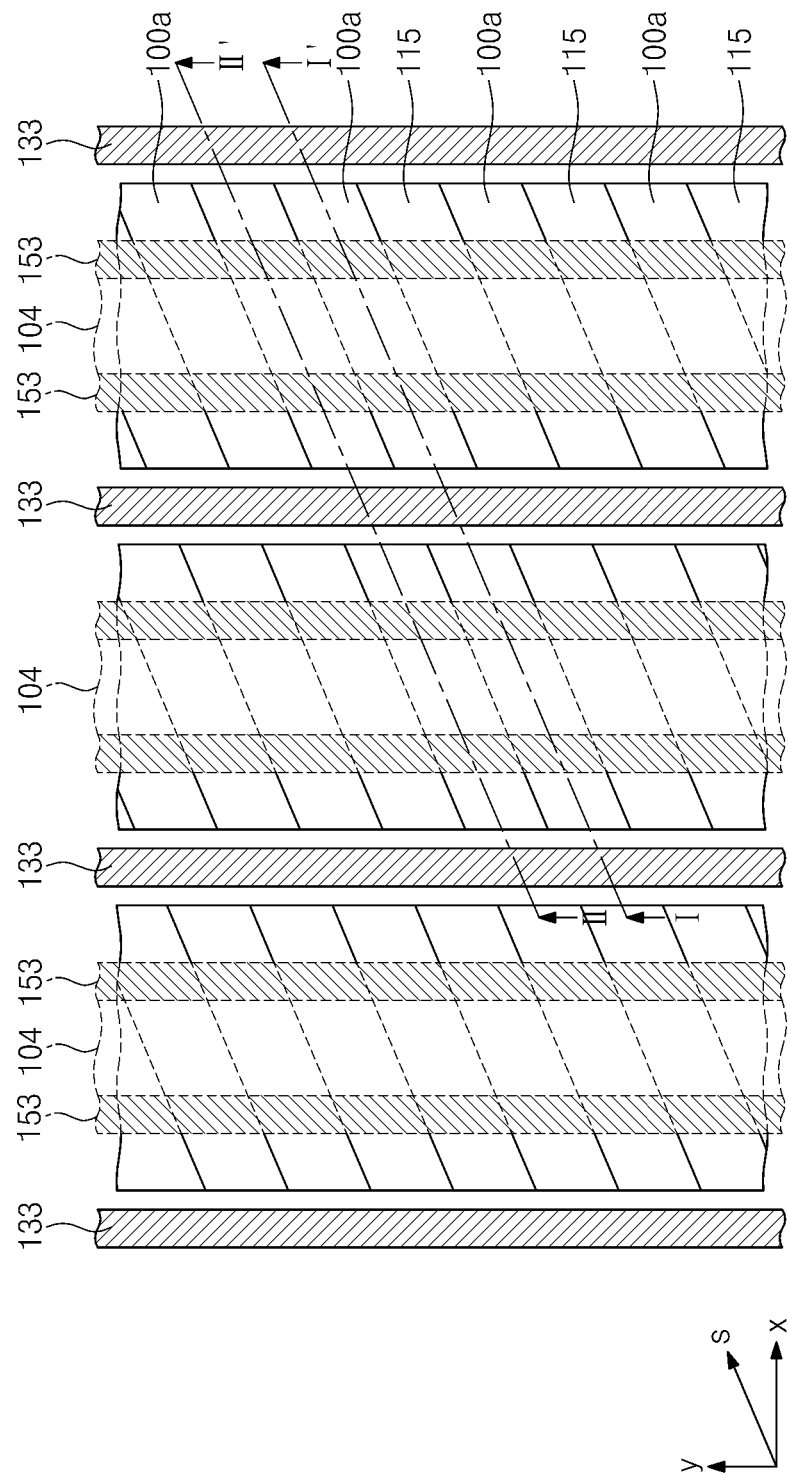
Figure 15B:
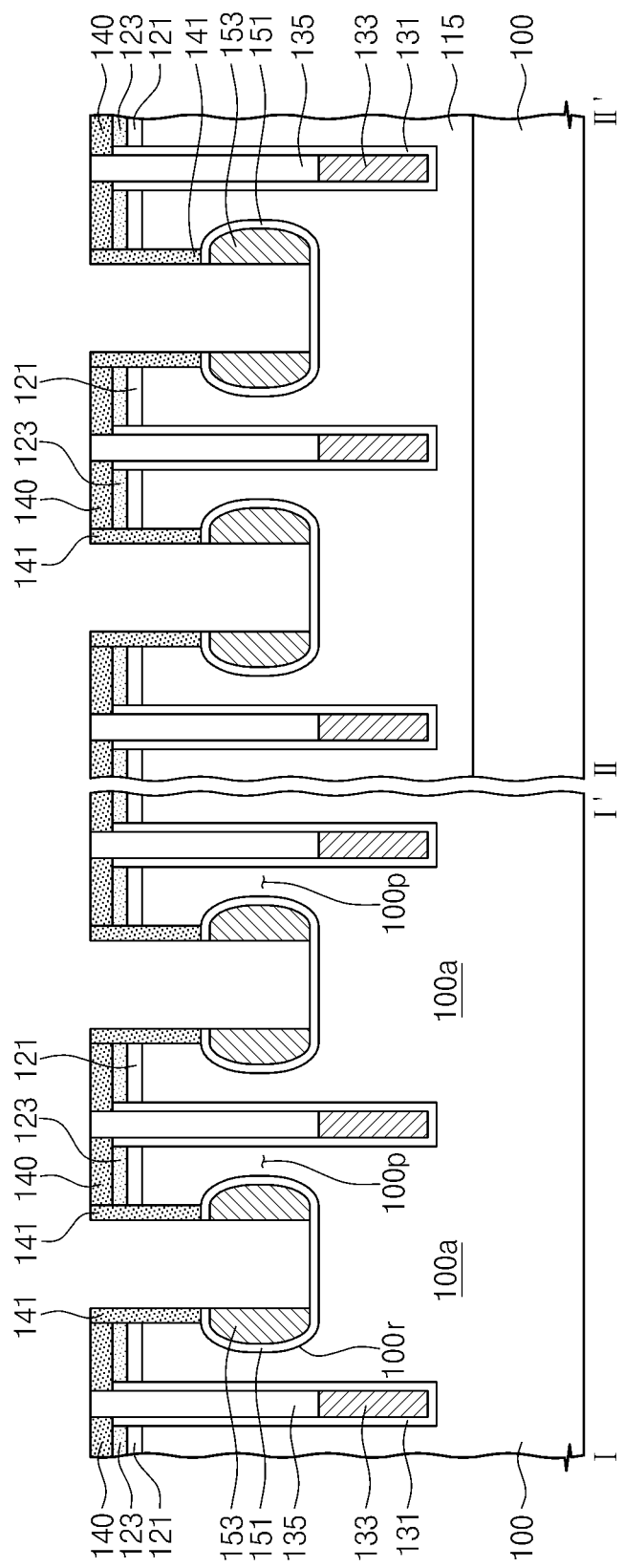

Referring to FIGS. 15A and 15B, a gate insulation layer 151 and main conductive lines 153 may be formed in recessed regions 100r.

Gate insulation layer 151 may be formed using a thermal oxidation process, for example. Alternatively, gate insulation layer 151 may be formed using an atomic layer deposition (ALD) process. The gate insulation layer 151 may be formed to include at least one of an oxide material, a nitride material, an oxynitride material and a high-k dielectric material (e.g., a hafnium oxide layer or an aluminum oxide layer).

Two main conductive lines 153 may be formed between the pair of active pillars 100p included in each active patterns 100a. The main conductive lines 153 may be formed in recessed regions 100r surrounded by gate insulation layer 151. The main conductive lines 153 may completely fill, or only partially fill, recessed regions 100r.

Forming main conductive lines 153 may include depositing a second conductive layer in recessed regions 100r surrounded by gate insulation layer 151 and removing second conductive layer in second trenches (104 of FIGS. 12B and 13B) between recessed regions 100r.

The second conductive layer may be formed using an atomic layer deposition (ALD) process or a chemical vapor deposition (CVD) process, for example. The second conductive layer may be formed of a doped semiconductor material (e.g., a doped silicon material, a doped germanium material and/or a doped silicon-germanium material). Alternatively, the second conductive layer may be formed of a conductive metal nitride material, a metal material or a metal silicide material, for example.

The second conductive layer may be deposited to completely fill second trenches 104 including recessed regions 100r. Alternatively, the second conductive layer may be deposited to fill recessed regions 100r and to partially fill second trenches 104. In this case, second trenches 104 on the second conductive layer may be completely filled with a sacrificial layer (not shown).

Removing the second conductive layer in second trenches (104 of FIGS. 12B and 13B) between recessed regions 100r may include anisotropically etching the second conductive layer using first sidewall spacers 141 and hard mask spacers 140 as etch masks until gate insulation layer 151 on the bottoms of second trenches 104 is exposed. As a result, main conductive lines 153 may be formed in respective ones of recessed regions 100r. The main conductive lines 153 formed after the anisotropic etching process may include sidewalls that are vertically self-aligned with the sidewalls of preliminary trenches 102.

After removal of the second conductive layer in second trenches 104, the bottom surfaces of second trenches 104 may be exposed by an over etching step of the anisotropic etching process.

In an exemplary embodiment in accordance with principles of inventive concepts, during removal of the second conductive layer in second trenches 104, main conductive lines 153 may be laterally etched to form main conductive lines 153a of an exemplary embodiment in accordance with principles of inventive concepts illustrated in FIG. 5.

In some exemplary embodiments in accordance with principles of inventive concepts, the process for forming recessed regions 100r may be omitted. That is, gate insulation layer 151 and main conductive lines 153 may be formed in second trenches 104 without formation of recessed regions 100r after second trenches 104 are formed, as illustrated in FIG. 6. Specifically, gate insulation layer 151 and main conductive lines 153 illustrated in FIG. 6 may be formed by sequentially depositing a gate insulation layer and a gate conductive layer in trenches 104 and partially removing the gate insulation layer and the gate conductive layer to expose the bottom surfaces of second trenches 104, for example.

Figure 16A:
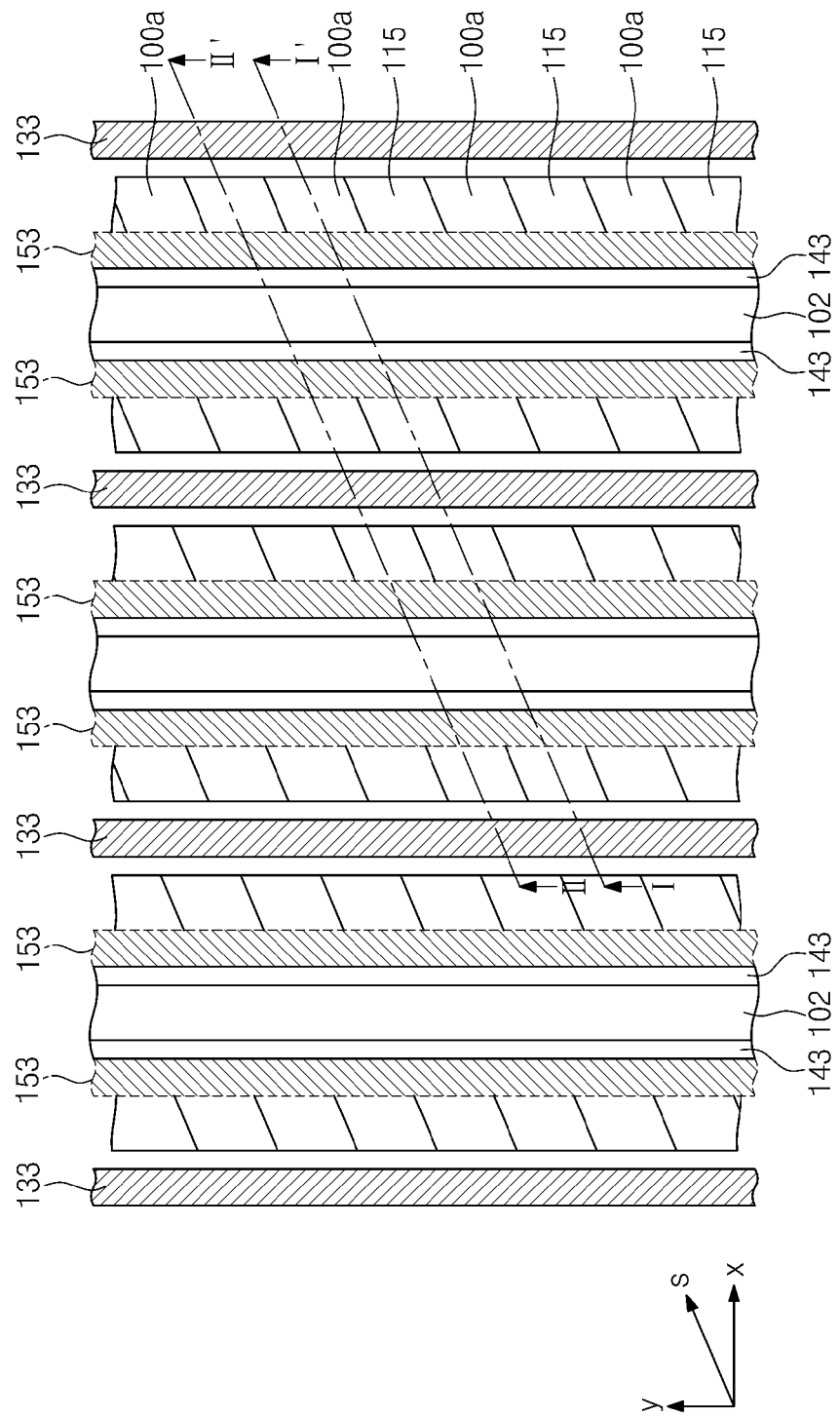
Figure 16B:
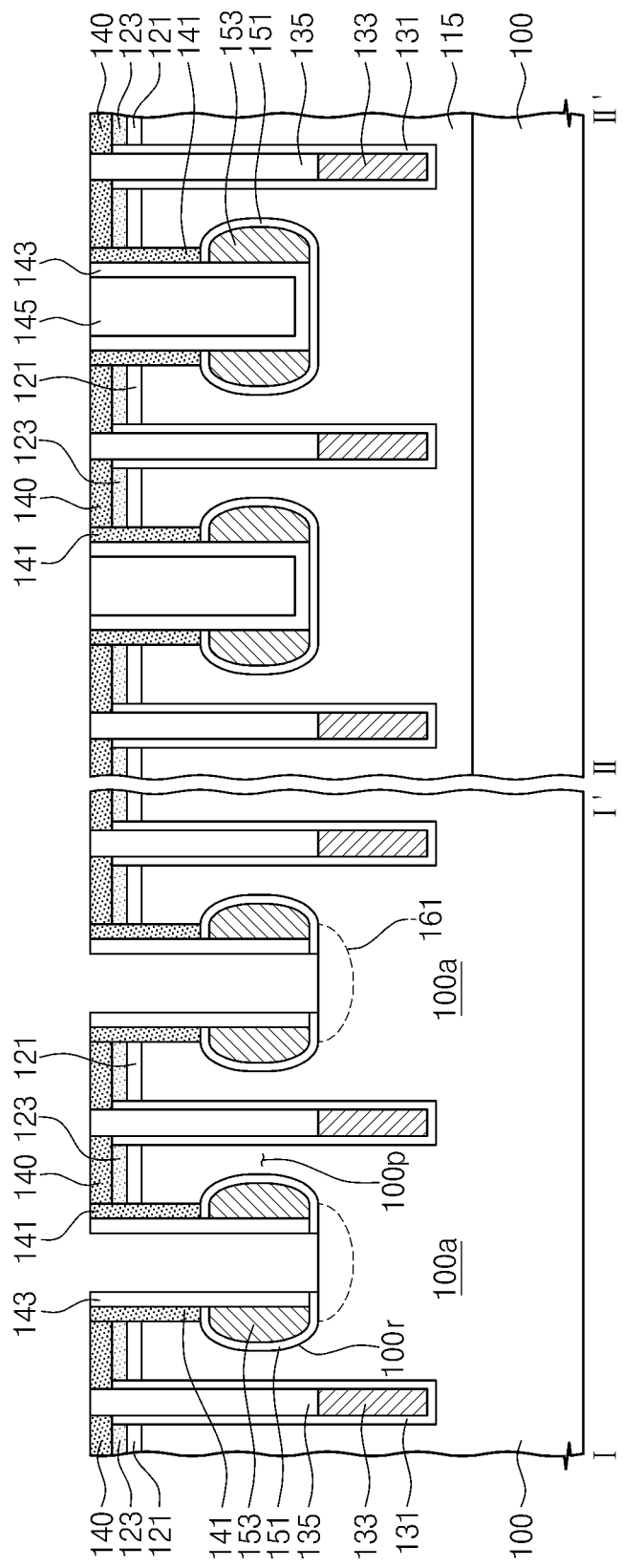

Referring to FIGS. 16A and 16B, second sidewall spacers 143 may be formed on sidewalls of main conductive lines 153. Specifically, a second sidewall spacer layer may be conformally formed on an entire surface of the substrate including main conductive lines 153. A filling dielectric layer may be formed on the second sidewall spacer layer to fill the second trenches, and the filling dielectric layer may be planarized to expose hard mask spacers 140 and to form filling dielectric patterns 145 in trenches and second sidewall spacers 143 on the sidewalls of main conductive lines 153. The filling dielectric patterns 145 may be formed of an insulation material having an etch selectivity with respect to second sidewall spacers 143 and hard mask spacers 140. For example, second sidewall spacers 143 and hard mask spacers 140 may be formed of a nitride layer and/or an oxynitride layer, and filling dielectric patterns 145 may be formed of an oxide layer.

In an exemplary embodiment in accordance with principles of inventive concepts, prior to formation of second sidewall spacers 143, main conductive lines 153 may be laterally etched using an isotropic etching process. As a result, main conductive lines 153a illustrated in FIG. 5 may be formed.

The filling dielectric patterns 145 and gate insulation layer 151 may be patterned to form openings that are disposed between active pillars 100p. The openings may expose active patterns 100a. Specifically, after formation of filling dielectric patterns 145, a mask pattern (not shown) having openings may be formed on the substrate including filling dielectric patterns 145. The openings in the mask pattern may expose portions of each of filling dielectric patterns 145. The filling dielectric patterns 145 and second sidewall spacers 143 may be etched using the mask pattern as an etch mask. As a result, common contact holes may be formed between active pillars 100p, and portions of gate insulation layer 151 may be exposed by respective ones of the common contact holes. The filling dielectric patterns 145 on first isolation patterns 115 may remain.

Impurity ions may be implanted into active patterns 100a under common contact holes to form common impurity regions 161. The gate insulation layer 151 exposed by the common contact holes may act as a buffer layer during formation of common impurity regions 161. After formation of common impurity regions 161, insulation layer 151 exposed by the common contact holes may be removed to expose common impurity regions 161.

Figure 17A:
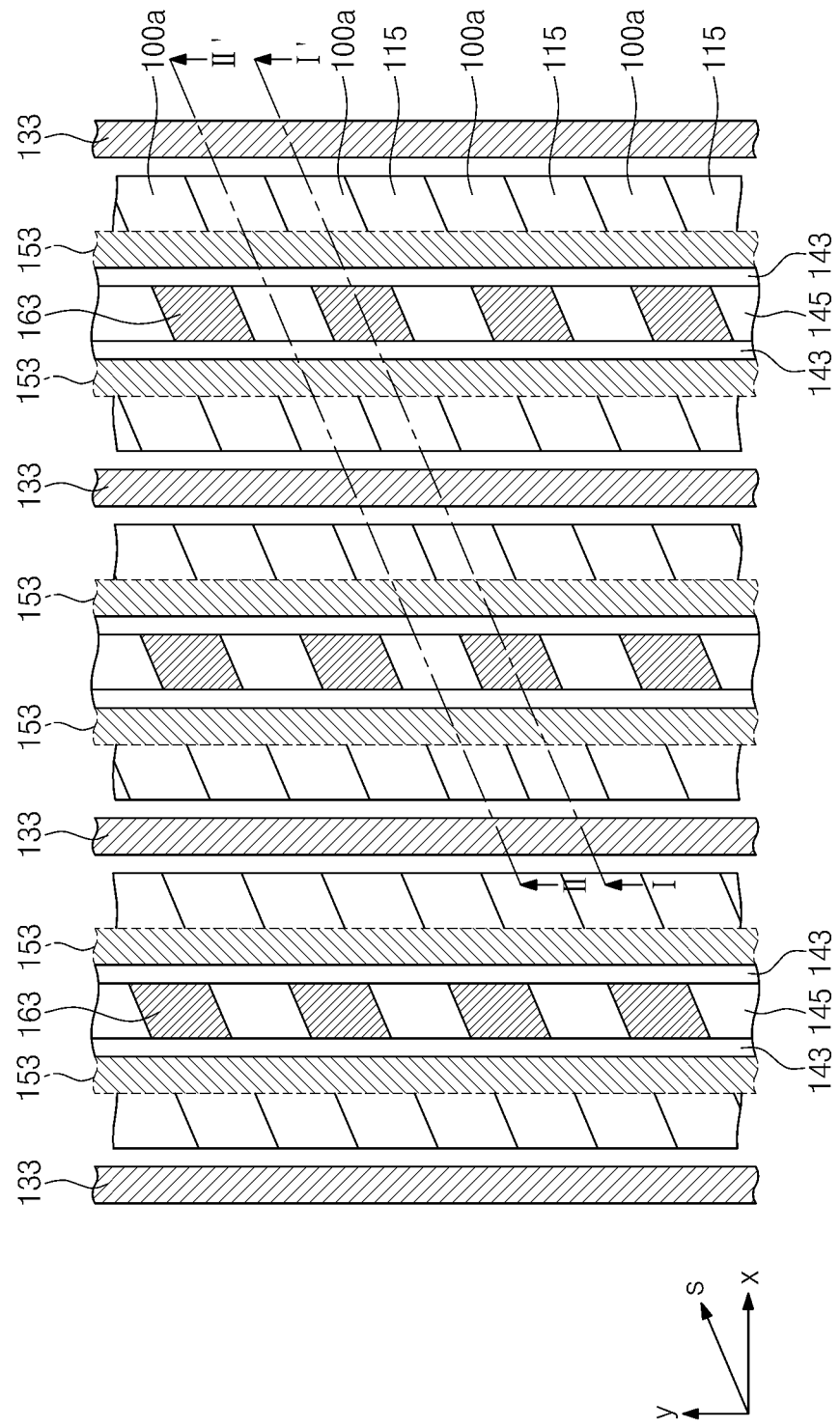
Figure 17B:
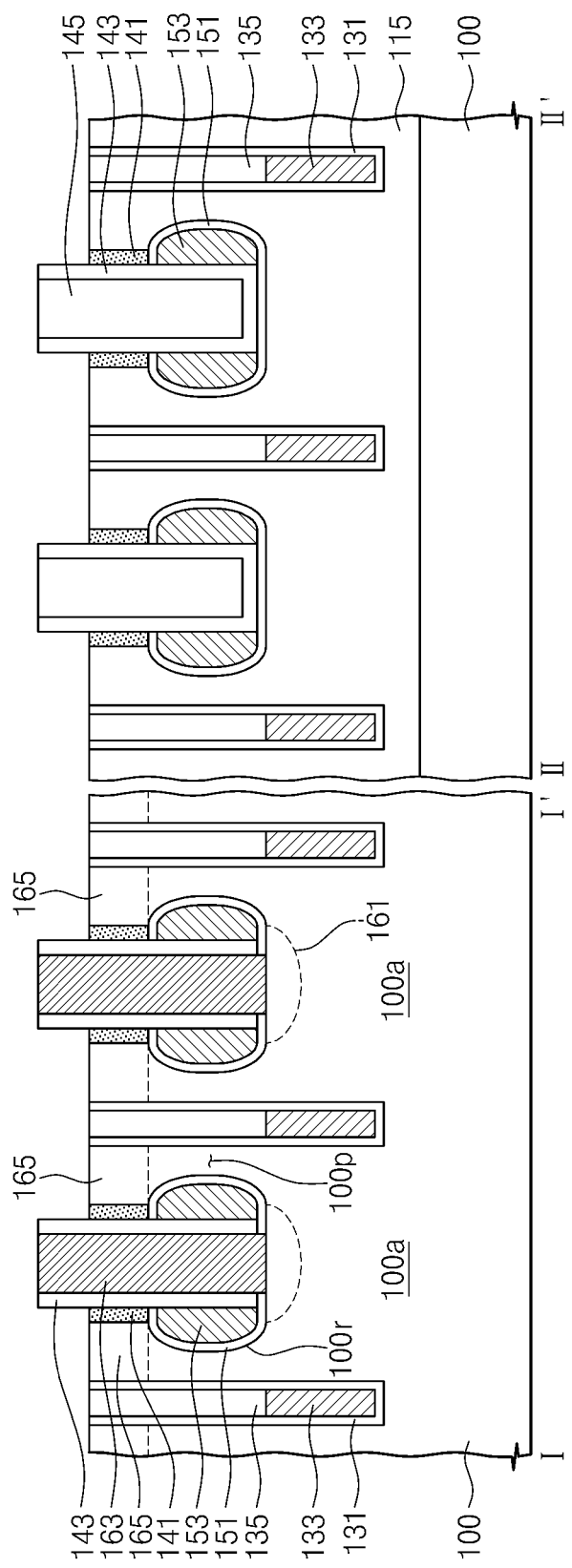

Referring to FIGS. 17A and 17B, common contact plugs 163 may be formed in the common contact holes, respectively. Specifically, a conductive layer filling the common contact holes may be formed on an entire surface of the substrate including the common contact holes, and the conductive layer may be planarized to expose top surfaces of hard mask spacers 140. As a result, common contact plugs 163 may be formed in the common contact holes.

After formation of common contact plugs 163, hard mask spacers 140, etch stop layer 123 and pad insulation layer 121 may be removed to expose top surfaces of active pillars 100p and first isolation patterns 115. Upper portions of common contact plugs 163 may relatively protrude from the top surfaces of active pillars 100p. Impurity ions may be implanted into upper portions of active pillars 100p to from upper impurity regions 165.

Figure 18A:
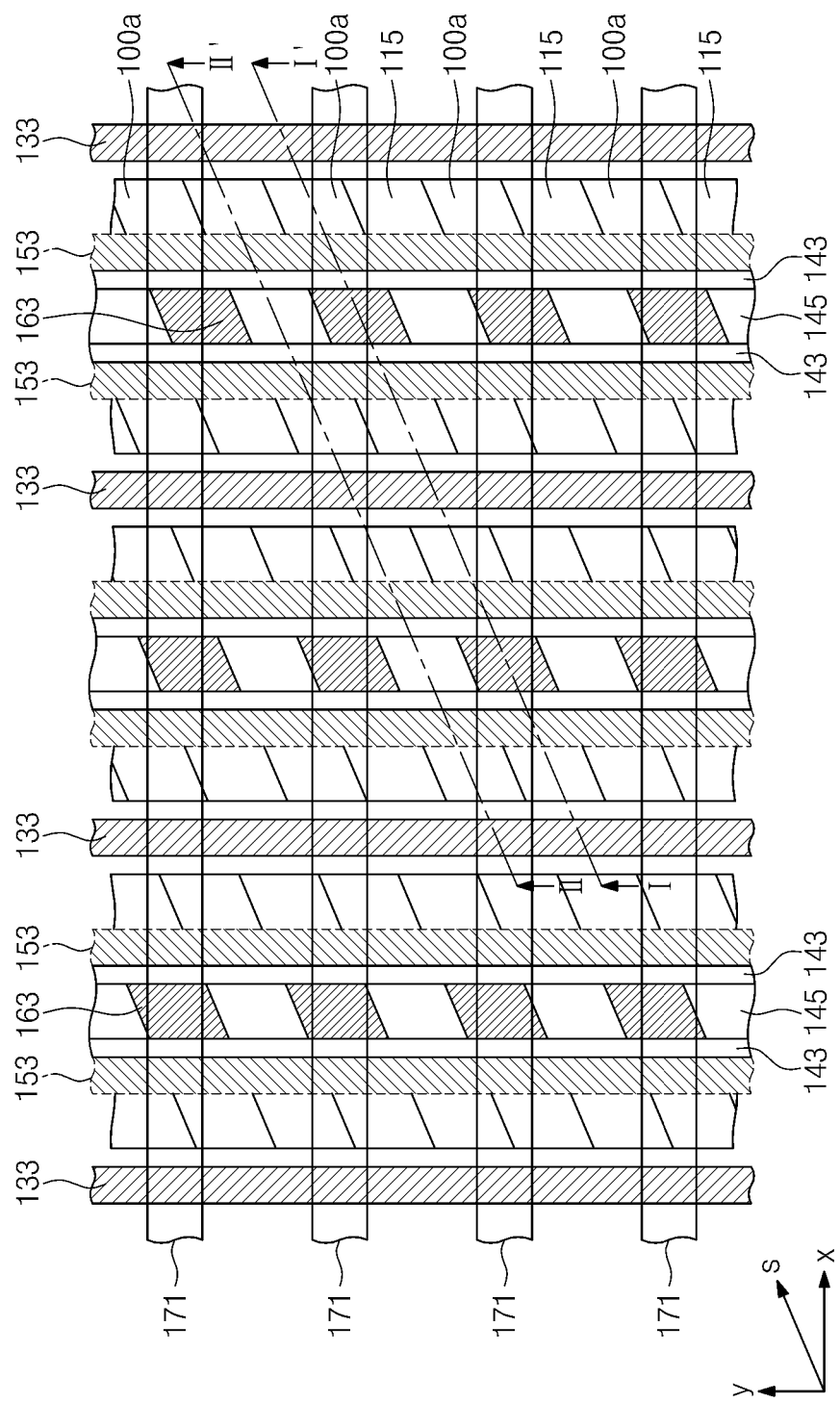
Figure 18B:
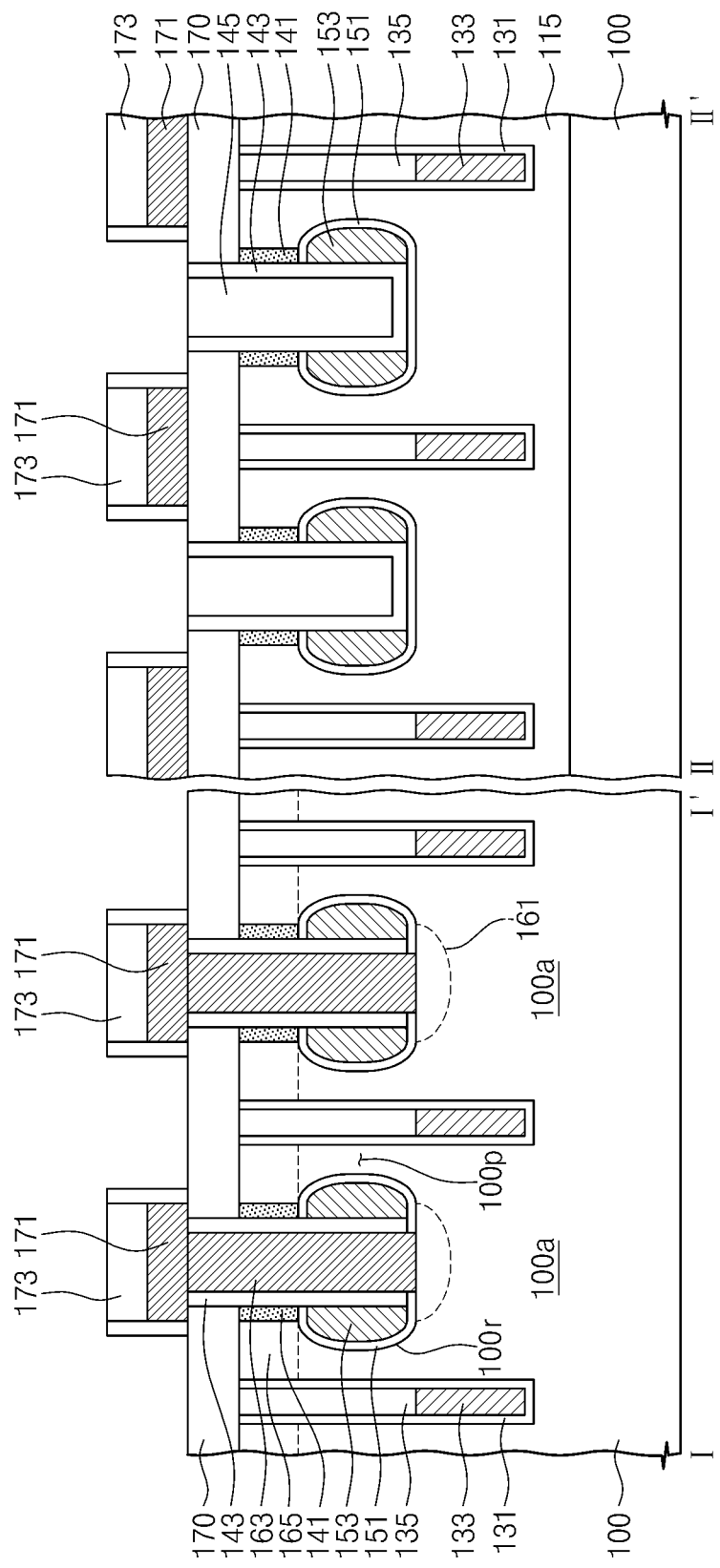

Referring to FIGS. 18A and 18B, a first interlayer insulation layer 170 may be formed on an entire surface of the substrate including upper impurity regions 165. The first interlayer insulation layer 170 may be planarized until top surfaces of common contact plugs 163 are exposed.

Common conductive lines 171 may be formed on first interlayer insulation layer 170. The common conductive lines 171 may be formed to contact common contact plugs 163. The common conductive lines 171 may be disposed to cross over auxiliary and main conductive lines 133 and 153. Capping insulation patterns 173 may be additionally formed on respective ones of common conductive lines 171.

Forming common conductive lines 171 and capping insulation patterns 173 may include depositing a third conductive layer and a capping insulation layer on the substrate including first interlayer insulation layer 170, and patterning the capping insulation layer and the third conductive layer, for example. In addition, spacers may be formed on sidewalls of stack patterns including capping insulation patterns 173 and common conductive lines 171, respectively.

The third conductive layer may be formed to include at least one of a metal material (e.g., a tungsten material, a titanium material or a tantalum material), a conductive metal nitride material (e.g., a titanium nitride material or a tantalum nitride material) and a metal-semiconductor compound material (e.g., a tungsten silicide material, a cobalt silicide material or a titanium silicide material), for example. The capping insulation layer may be formed of an oxide layer, a nitride layer and/or an oxynitride layer, for example.

Referring again to FIG. 2, a second interlayer insulation layer 180 may be formed on an entire surface of the substrate including common conductive lines 171. Contact plugs 181 penetrating first and second interlayer insulation layers 170 and 180 may be formed. The contact plugs 181 may be formed to be electrically connected to respective ones of upper impurity regions 165. Data storage elements 190 may be formed on contact plugs 181, respectively. Each of data storage elements 190 may include a capacitor or a variable resistor, for example.

Exemplary embodiments of semiconductor devices in accordance with principles of inventive concepts described above may be encapsulated using various packaging techniques. For example, they may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique, for example.

Figure 19:
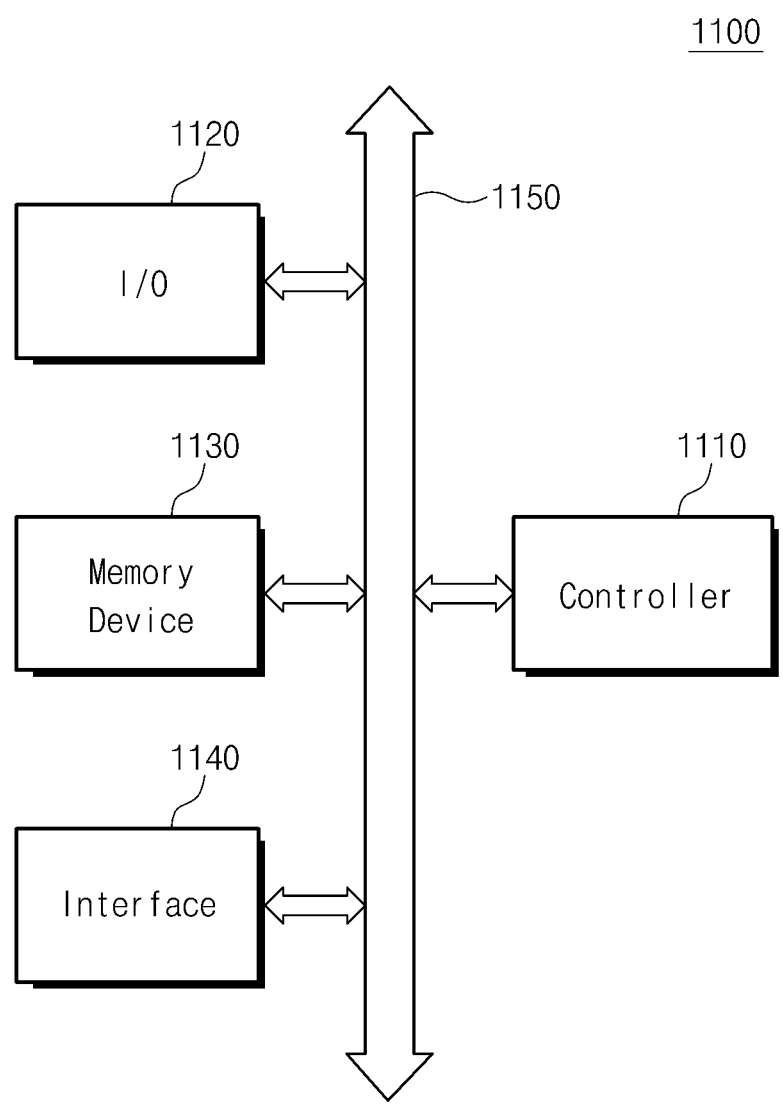
FIG. 19 is a schematic block diagram illustrating an example of electronic systems including semiconductor devices in accordance with principles of inventive concepts.

FIG. 19 is a schematic block diagram illustrating an example of electronic systems including a semiconductor device in accordance with principles of inventive concepts. An electronic system 1100 according to an exemplary embodiment may include a controller 1110, an input/output (I/O) unit 1120, a memory device 1130, an interface unit 1140 and a data bus 1150. At least two of controller 1110, I/O unit 1120, memory device 1130 and interface unit 1140 may communicate with each other through data bus 1150. The data bus 1150 may correspond to a path through which electrical signals are transmitted.

The controller 1110 may include at least one of a microprocessor, a digital signal processor (DSP), a microcontroller and a logic device. The logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include at least one semiconductor device in accordance with principles of inventive concepts as described in the discussion related to FIGS. 1 to 8. Memory device 1130 may further include another type of semiconductor memory device that is different from the semiconductor devices described in the above embodiments. For example, the memory device 1130 may further include a flash memory device. The interface unit 1140 may transmit electrical data to a communication network or may receive electrical data from a communication network. The interface unit 1140 may operate by wireless or cable. For example, interface unit 1140 may include an antenna for wireless communication or a transceiver for cable communication. Although not shown in the drawings, electronic system 1100 may further include a memory device that acts as a cache memory for improving an operation of controller 1110.

The electronic system 1100 may be applied to a personal digital assistant (PDA), a portable computer, a web tablet, a wireless phone, a mobile phone, a digital music player or a memory card, for example. The electronic system 1100 may also be applied to another electronic product that receives or transmits information data by wireless.

Figure 20:
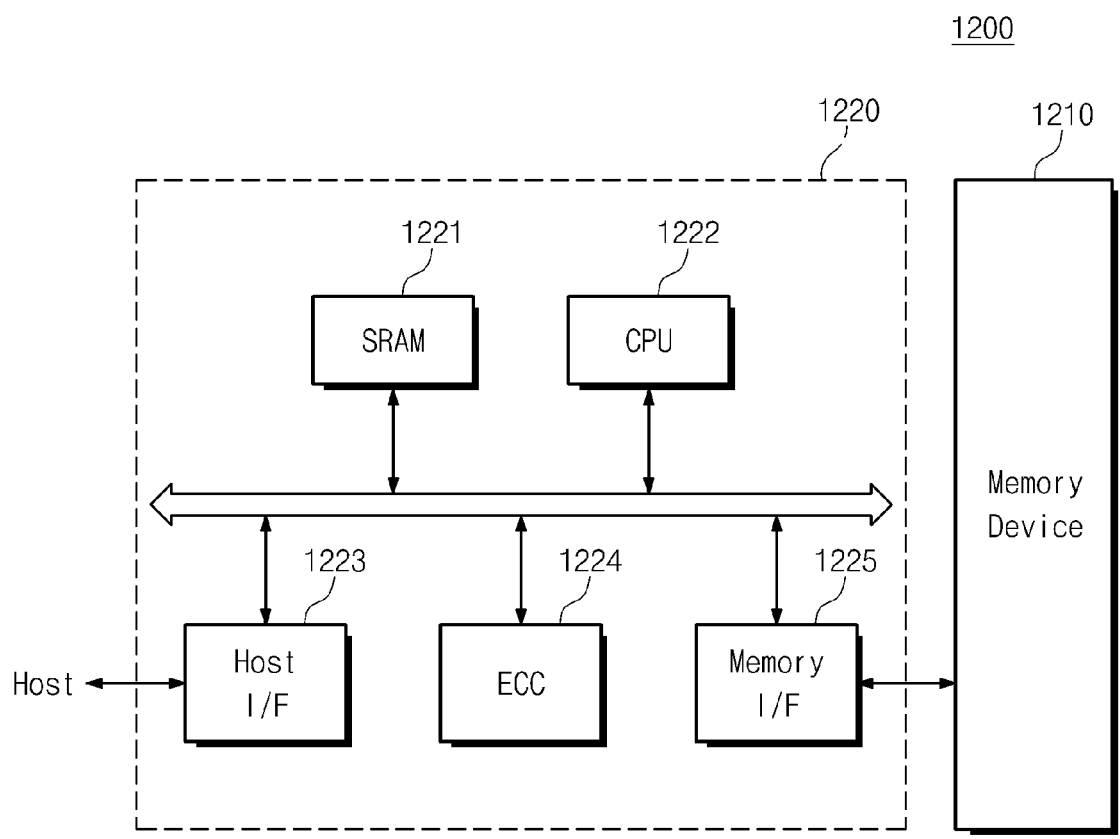
FIG. 20 is a schematic block diagram illustrating an example of memory cards including semiconductor devices in accordance with principles of inventive concepts.

FIG. 20 is a schematic block diagram illustrating an example of memory cards including the semiconductor devices in accordance with principles of inventive concepts.

Referring to FIG. 20, a memory card 1200 may include a memory device 1210. The memory device 1210 may include at least one of the semiconductor devices (e.g., non-volatile memory devices and/or DRAM devices) in accordance with principles of inventive concepts mentioned above. The memory device 1210 may further include another type of semiconductor memory device that is different from semiconductor devices according to exemplary embodiment in accordance with principles of inventive concepts described above. For example, memory device 1210 may additionally include a flash memory device. The memory card 1200 may include a memory controller 1220 that controls data communication between a host and memory device 1210.

The memory controller 1220 may include a central processing unit (CPU) 1222 that controls overall operations of memory card 1200. In addition, memory controller 1220 may include an SRAM device 1221 used as an operation memory of CPU 1222. Moreover, memory controller 1220 may further include a host interface unit 1223 and a memory interface unit 1225. The host interface unit 1223 may be configured to include a data communication protocol between memory card 1200 and the host. The memory interface unit 1225 may connect memory controller 1220 to memory device 1210. The memory controller 1220 may further include an error check and correction (ECC) block 1224. The ECC block 1224 may detect and correct errors of data that are read out from memory device 1210. Even though not shown in the drawings, memory card 1200 may additionally include a read only memory (ROM) device that stores code data to interface with the host. The memory card 1200 may be used as a portable data storage card. Alternatively, memory card 1200 may replace hard disks of computer systems as solid state disks of the computer systems.

According to the exemplary embodiments in accordance with principles of inventive concepts set forth above, active pillars may be formed using hard mask spacers. Active pillars thus-formed and used as channels of vertical transistors may be formed to have a uniform width.

Additionally, auxiliary conductive lines may be formed to be adjacent to outer sidewalls of the active pillars and may extend in the second direction. In such a configuration, when an appropriate bias is applied to the auxiliary conductive lines, the channel regions in the active pillars may not be floated. Therefore, a highly integrated and high reliable semiconductor device can be realized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a semiconductor substrate including first trenches defining outer sidewalls of a pair of active pillars and a second trench defining opposing inner sidewalls of the pair of active pillars, the second trench having a bottom surface located at a higher level than bottom surfaces of the first trenches;
   auxiliary conductive lines disposed in respective ones of the first trenches to cover and cross the outer sidewalls of the pair of active pillars;
   a pair of main conductive lines, each disposed in one of a pair of recessed regions that are laterally recessed from lower portions of the inner sidewalls of the active pillars into the pair of active pillars, wherein top surfaces of the auxiliary conductive lines are disposed at a lower level than top surfaces of the main conductive lines;
   a common impurity region disposed between the main conductive lines and in the semiconductor substrate under the second trench; and
   upper impurity regions disposed in upper portions of the active pillars.

2. The semiconductor device of claim 1, wherein a conductivity type of the auxiliary conductive lines is different from a conductivity type of the main conductive lines.

3. The semiconductor device of claim 1, wherein lower portions of the auxiliary conductive lines are in direct contact with the semiconductor substrate.

4. The semiconductor device of claim 1, wherein each of the main conductive lines has a first sidewall adjacent to a corresponding active pillar and having a rounded shape and a second sidewall being vertically self-aligned with the inner sidewall of an upper portion of the corresponding active pillar.

5. A semiconductor device comprising:
   a semiconductor substrate including first trenches defining outer sidewalls of a pair of active pillars and a second trench defining opposing inner sidewalls of the pair of active pillars, the second trench having a bottom surface located at a higher level than bottom surfaces of the first trenches;
   auxiliary conductive lines disposed in respective ones of the first trenches to cover and cross the outer sidewalls of the pair of active pillars;
   a pair of main conductive lines, each disposed in one of a pair of recessed regions that are laterally recessed from lower portions of the inner sidewalls of the active pillars into the pair of active pillars, a common impurity region disposed between the main conductive lines and in the semiconductor substrate under the second trench;
   upper impurity regions disposed in upper portions of the active pillars;
   a buffer insulation layer between the auxiliary conductive lines and the outer sidewalls of the active pillars; and
   a gate insulation layer between the main conductive lines and the inner sidewalls of the active pillars.

6. A semiconductor device comprising:
   a semiconductor substrate including first trenches defining outer sidewalls of a pair of active pillars and a second trench defining opposing inner sidewalls of the pair of active pillars, the second trench having a bottom surface located at a higher level than bottom surfaces of the first trenches;
   auxiliary conductive lines disposed in respective ones of the first trenches to cover and cross the outer sidewalls of the pair of active pillars;
   a pair of main conductive lines, each disposed in one of a pair of recessed regions that are laterally recessed from lower portions of the inner sidewalls of the active pillars into the pair of active pillars, a common impurity region disposed between the main conductive lines and in the semiconductor substrate under the second trench;
   upper impurity regions disposed in upper portions of the active pillars;
   a pair of first isolation patterns between which the pair of active pillars are disposed; and
   second isolation patterns filling the first trenches on the auxiliary conductive lines,
   wherein the first isolation patterns are non-parallel with the second isolation patterns, and bottom surfaces of the second isolation patterns are located at a higher level than bottom surfaces of the first isolation patterns.

7. A semiconductor device comprising:
   a semiconductor substrate including first trenches defining outer sidewalls of a pair of active pillars and a second trench defining opposing inner sidewalls of the pair of active pillars, the second trench having a bottom surface located at a higher level than bottom surfaces of the first trenches;
   auxiliary conductive lines disposed in respective ones of the first trenches to cover and cross the outer sidewalls of the pair of active pillars;
   a pair of main conductive lines, each disposed in one of a pair of recessed regions that are laterally recessed from lower portions of the inner sidewalls of the active pillars into the pair of active pillars, a common impurity region disposed between the main conductive lines and in the semiconductor substrate under the second trench;
   upper impurity regions disposed in upper portions of the active pillars;

a common contact plug disposed in the second trench and electrically connected to the common impurity region;
sidewall spacers between the common contact plug and the main conductive lines; and
a common conductive line crossing over the auxiliary conductive lines and the main conductive lines and being electrically connected to the common contact plug.

\* \* \* \* \*